United States Patent
Hasebe et al.

(10) Patent No.: US 9,758,865 B2
(45) Date of Patent: Sep. 12, 2017

(54) SILICON FILM FORMING METHOD, THIN FILM FORMING METHOD AND CROSS-SECTIONAL SHAPE CONTROL METHOD

(71) Applicant: TOKYO ELECTRON LIMITED, Tokyo (JP)

(72) Inventors: Kazuhide Hasebe, Nirasaki (JP); Kazuya Takahashi, Nirasaki (JP); Katsuhiko Komori, Nirasaki (JP); Yoshikazu Furusawa, Nirasaki (JP); Mitsuhiro Okada, Nirasaki (JP); Hiroyuki Hayashi, Nirasaki (JP); Akinobu Kakimoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 5 days.

(21) Appl. No.: 14/447,060

(22) Filed: Jul. 30, 2014

(65) Prior Publication Data
US 2015/0037970 A1   Feb. 5, 2015

(30) Foreign Application Priority Data

Jul. 31, 2013 (JP) .................................. 2013-159604
May 21, 2014 (JP) .................................. 2014-104835

(51) Int. Cl.
*C23C 16/00* (2006.01)
*C23C 16/04* (2006.01)
(Continued)

(52) U.S. Cl.
CPC ............ *C23C 16/045* (2013.01); *C23C 16/24* (2013.01); *H01L 21/28556* (2013.01);
(Continued)

(58) Field of Classification Search
CPC .......................... C23C 16/45525; C23C 15/24
(Continued)

(56) References Cited

U.S. PATENT DOCUMENTS 6,673,718 B1 * 1/2004 Lee .................. H01L 21/76843
257/E21.586
2011/0263105 A1 * 10/2011 Hasebe ............... C23C 16/0272
438/482

(Continued)

FOREIGN PATENT DOCUMENTS

JP    63-029954 A    2/1988
JP    01-217956 A    8/1989
(Continued)

*Primary Examiner* — Kelly M Gambetta
(74) *Attorney, Agent, or Firm* — Nath, Goldberg & Meyer; Jerald L. Meyer

(57) ABSTRACT

The present disclosure provides a silicon film forming method for forming a silicon film on a workpiece having a processed surface, including: forming a seed layer by supplying a high-order aminosilane-based gas containing two or more silicon atoms in a molecular formula onto the processed surface and by having silicon adsorbed onto the processed surface; and forming a silicon film by supplying a silane-based gas not containing an amino group onto the seed layer and by depositing silicon onto the seed layer, wherein, when forming a seed layer, a process temperature is set within a range of 350 degrees C. or lower and a room temperature or higher.

29 Claims, 26 Drawing Sheets

(51) Int. Cl.
  *C23C 16/24* (2006.01)
  *H01L 21/285* (2006.01)
  *H01L 21/3205* (2006.01)
  *H01L 21/768* (2006.01)

(52) U.S. Cl.
  CPC .. *H01L 21/32055* (2013.01); *H01L 21/76876* (2013.01); *H01L 21/76877* (2013.01); *H01L 2221/1089* (2013.01)

(58) Field of Classification Search
  USPC ...................................................... 427/248.1
  See application file for complete search history.

(56) References Cited

U.S. PATENT DOCUMENTS

| | | | |
|---|---|---|---|
| 2012/0028437 A1* | 2/2012 | Watanabe | H01L 21/02164 438/425 |
| 2012/0103518 A1* | 5/2012 | Kakimoto | C23C 16/0272 156/345.1 |
| 2013/0084693 A1 | 4/2013 | Kakimoto et al. | |
| 2013/0323435 A1* | 12/2013 | Xiao | C09D 1/00 427/579 |

FOREIGN PATENT DOCUMENTS

| | | |
|---|---|---|
| JP | 2011-249744 A | 12/2011 |
| JP | 2011-249764 A | 12/2011 |
| JP | 2012-138627 A | 7/2012 |
| JP | 2012-147016 A | 8/2012 |
| JP | 2012-147017 A | 8/2012 |
| JP | 2012-147018 A | 8/2012 |
| JP | 2012-178572 A | 9/2012 |
| JP | 2013-095945 A | 5/2013 |
| KR | 10-2011-0128145 A | 11/2011 |
| KR | 10-2013-0007430 A | 1/2013 |
| KR | 10-2013-0035913 A | 4/2013 |
| KR | 10-2013-0047580 A | 5/2013 |

* cited by examiner

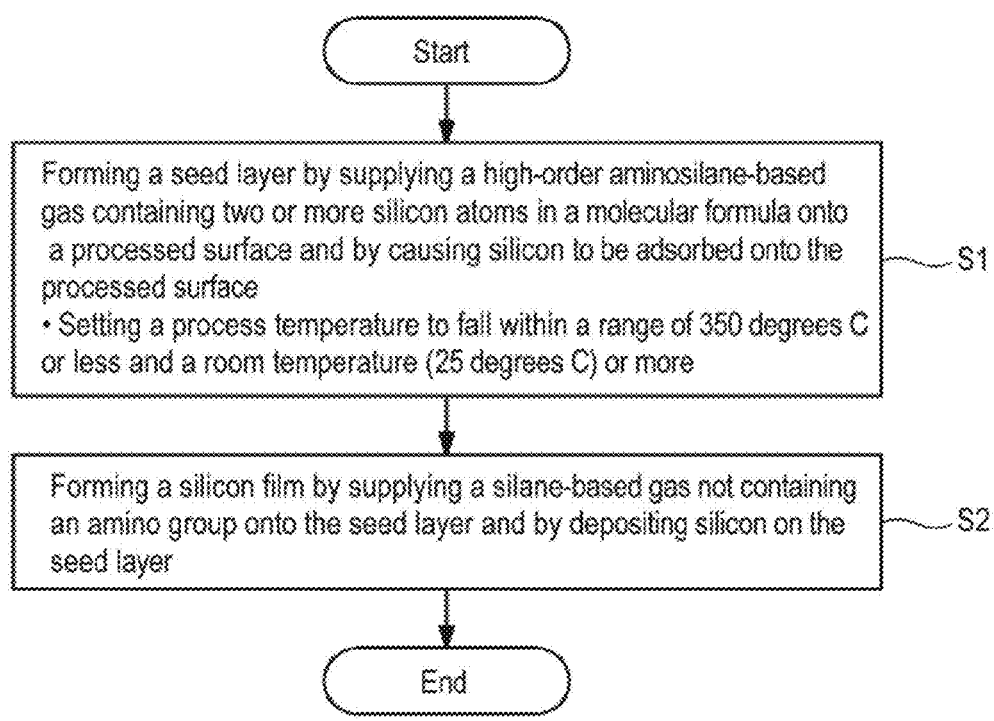

FIG. 12

| Target thickness | No seed layer | Aminosilane seed | High-order aminosilane seed |
|---|---|---|---|
| 8~9nm | Pinhole generated | Pinhole generated | No pinhole |
| 6~7nm | Pinhole generated | Pinhole generated | No pinhole |
| 4~5nm | Pinhole generated | Pinhole generated | Pinhole generated |

Monosilane gas used as source gas of silicon film 4

FIG. 13

| | | No seed layer | Aminosilane seed | High-order aminosilane seed |
|---|---|---|---|---|
| Target thickness | 4~5nm | Pinhole generated | No pinhole | No pinhole |
| | 3~4nm | Pinhole generated | No pinhole | No pinhole |
| | 2~3nm | Pinhole generated | Pinhole generated | No pinhole |

High-order silane-based gas used as source gas of silicon film 4

Etching coverage : 0%

Etching coverage : 100%

Aspect ratio : 37.5

Aspect ratio : 12

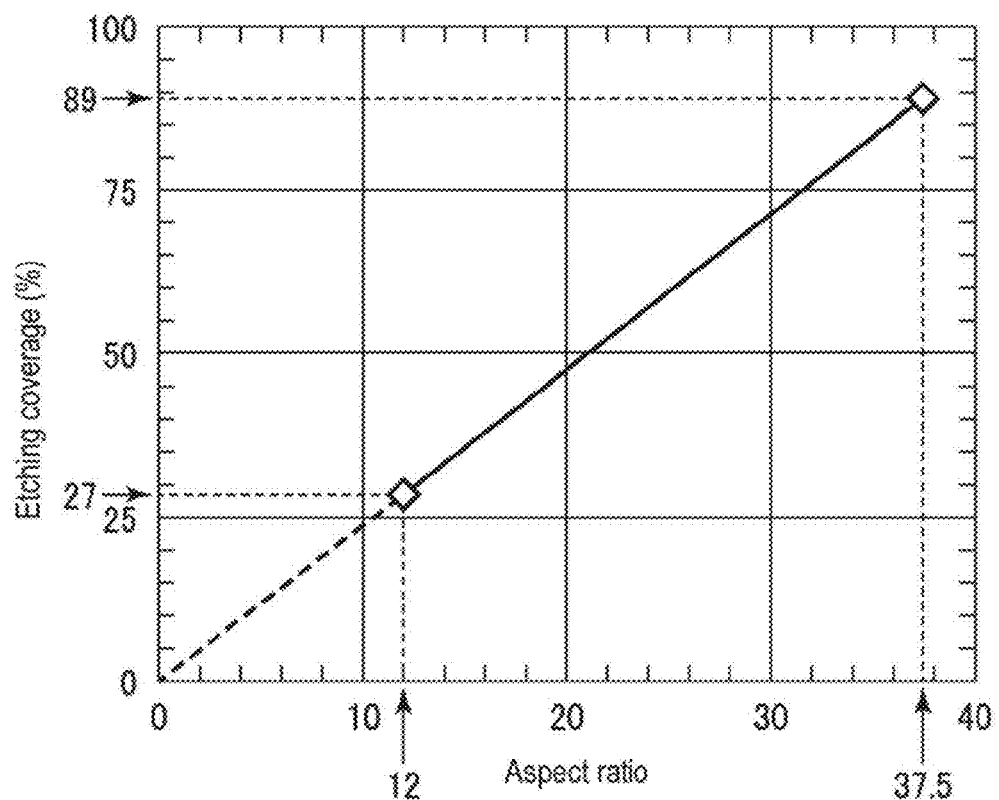

FIG. 25A
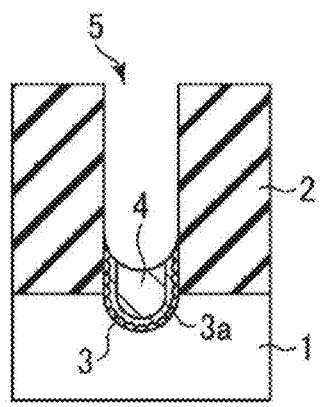
FIG. 25B    FIG. 25C    FIG. 25D
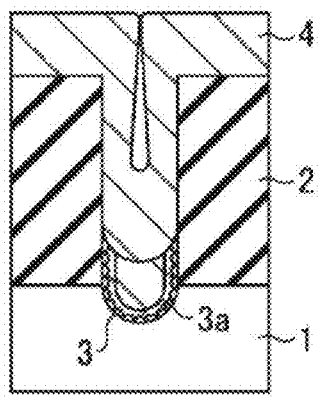 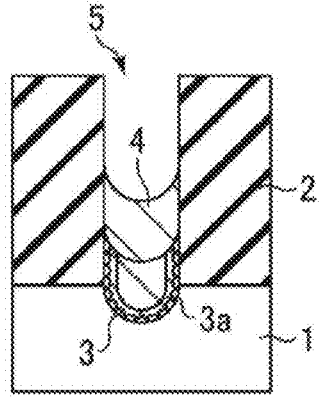 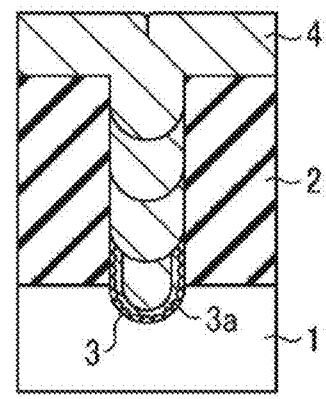

SILICON FILM FORMING METHOD, THIN FILM FORMING METHOD AND CROSS-SECTIONAL SHAPE CONTROL METHOD

CROSS-REFERENCE TO RELATED APPLICATIONS

This application claims the benefit of Japanese Patent Application Nos. 2013-159604 and 2014-104835, filed on Jul. 31, 2013 and May 21, 2014, respectively, in the Japan Patent Office, the disclosure of which is incorporated herein in their entirety by reference.

TECHNICAL FIELD

The present disclosure relates to a silicon film forming method, a thin film forming method and a cross-sectional shape control method.

BACKGROUND

In semiconductor integrated circuit devices, silicon, e.g., amorphous silicon is used for a thin film for filling a contact hole or line and forming a device or structure. There are known techniques for forming an amorphous silicon film by decomposing monosilane at a temperature ranging from 400 to 600 degrees C., disilane at a temperature ranging from 400 to 500 degrees C., trisilane at a temperature ranging from 350 to 450 degrees C., and tetrasilane at a temperature ranging from 300 to 400 degrees C.

However, when the contact hole or line with miniaturization is filled with amorphous silicon, the amorphous silicon after film forming has poor coverage at the contact hole portion, thereby resulting in large voids. If these large voids are caused at the contact hole or within a line, this may cause, e.g., an increase in resistance. In addition, this may cause degradation in accuracy of surface roughness of the amorphous silicon film.

In order to avoid a degradation in the accuracy of the surface roughness of the amorphous silicon film, an approach is known for supplying, before forming the amorphous silicon film, an aminosilane-based gas onto a surface of an underlayer such that a seed layer is formed on the underlayer.

In recent years, in addition to improving the accuracy of the surface roughness of the silicon film, e.g., the amorphous silicon film, a demand for further reducing film thickness becomes increasingly prevalent.

The aforementioned approach is capable of achieving the object of improving accuracy of the surface roughness. However, if the demand for further reducing film thickness is considered, a pinhole is easily generated near an order of 2 nm so that reducing film thickness to an order of 2 nm or less becomes difficult.

In the aforementioned approach, it is thought that, in addition to the aminosilane-based gas, a substance having two silicon atoms in a molecular formula, e.g., hexakisethylaminodisilane, etc., can be used in forming the seed layer. However, there is no description on a specific example in which hexakisethylaminodisilane is used.

SUMMARY

Some embodiments of the present disclosure provide a silicon film forming method capable of coping with a demand for further reduction in film thickness and capable of improving the accuracy of surface roughness. Some embodiments of the present disclosure provide a thin film forming method for, through the use of the silicon film forming method, forming a thin film on a workpiece having a processed surface and a hole or a groove defined on the processed surface. Some embodiments of the present disclosure provide a silicon film forming method for, through the use of the silicon film forming method, forming a silicon film on a workpiece having a processed surface and a hole or a groove defined on the processed surface. Some embodiments of the present disclosure provide a cross-sectional shape control method capable of controlling an in-hole or in-groove cross-sectional shape of a thin film formed along a hole or a groove.

According to one embodiment of the present disclosure, a silicon film forming method for forming a silicon film on a workpiece having a processed surface includes: forming a seed layer by supplying a high-order aminosilane-based gas containing two or more silicon atoms in a molecular formula onto the processed surface and by having silicon adsorbed onto the processed surface; and forming a silicon film by supplying a silane-based gas not containing an amino group onto the seed layer and by depositing silicon onto the seed layer, wherein, when forming a seed layer, a process temperature is set within a range of 350 degrees C. or lower and a room temperature or higher.

According to another embodiment of the present disclosure, a thin film forming method for forming a thin film on a workpiece having a processed surface and a hole or groove defined on the processed surface includes: forming multiple seed layers including a seed layer and a second seed layer on the processed surface; forming a silicon film at such a film thickness as not to close the hole or groove while leaving an opening portion corresponding to the hole or groove, by supplying a silane-based gas not containing an amino group onto the multiple seed layers and by depositing silicon on the multiple seed layers; enlarging the opening portion of the silicon film corresponding to the hole or groove by etching the silicon film while leaving the silicon film along the hole or groove; and forming an opening-portion-filling thin film on the silicon film whose opening portion is enlarged.

According to another embodiment of the present disclosure, a silicon film forming method for forming a silicon film on a workpiece having a processed surface and a hole or groove defined on the processed surface includes: forming multiple seed layers including a seed layer and a second seed layer on the processed surface; forming a silicon film by supplying a silane-based gas not containing an amino group onto the multiple seed layers and by depositing silicon on the multiple seed layers; and etching the silicon film while leaving the silicon film on a bottom of the hole or groove, wherein forming a silicon film and etching the silicon film are repeatedly performed to fill the hole or groove of the processed surface with the silicon film repeatedly formed.

According to another embodiment of the present disclosure, a cross-sectional shape control method for controlling an in-hole or in-groove cross-sectional shape of a thin film formed along a hole or groove includes: forming a thin film on a processed surface having a hole or groove formed thereon at such a film thickness as not to close the hole or groove while leaving an opening portion corresponding to the hole or groove, the thin film extending along the hole or groove; and enlarging the opening portion of the thin film corresponding to the hole or groove by etching the thin film while leaving the thin film along the hole or groove, wherein the in-hole or in-groove cross-sectional shape of the thin film subjected to enlarging the opening portion of the thin film corresponding to the hole or groove is controlled by changing an aspect ratio of the opening portion of the thin film obtained when forming a thin film on a processed surface having a hole or groove formed thereon.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating one example of sequences of a silicon film forming method according to a first embodiment of the present disclosure.

FIG. 12 is a photograph showing a secondary electron image of a surface of a silicon film when monosilane is used as a source gas.

FIG. 13 is a photograph showing a secondary electron image of a surface of a silicon film when high-order silane is used as a source gas.

FIG. 21 is a view showing a relationship between an aspect ratio and etching coverage.

FIGS. 25A to 25D are sectional views schematically showing states of a workpiece in another example of sequences on application example 3 of a silicon film forming method according to a second embodiment of the present disclosure.

DETAILED DESCRIPTION

Reference will now be made in detail to various embodiments, examples of which are illustrated in the accompanying drawings. Throughout the drawings, identical parts will be designated by like reference symbols. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Definition of Terms Used Herein

The term "amorphous silicon" used herein is defined not only to designate amorphous silicon in the present specification. The term "amorphous silicon" includes both nano crystal silicon which comprises amorphous or nano-sized crystal grains capable of achieving the accuracy of surface roughness disclosed in the present specification, and silicon which comprises the amorphous silicon and the nano crystal silicon mixed with each other. In the present specification, 1 Torr is defined to be 133 Pa.

<Film Forming Method>

Figure 2A:
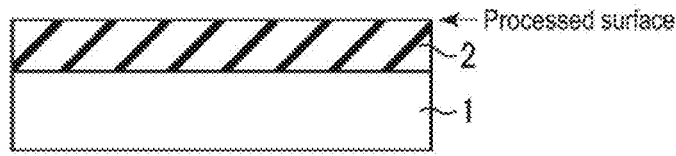
FIGS. 2A to 2C are sectional views schematically showing states of a workpiece during the sequences illustrated in FIG. 1.
Figure 2B:
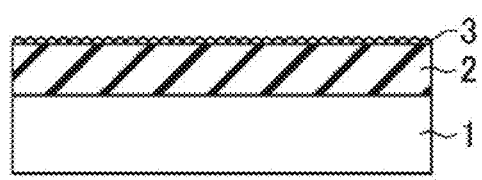
Figure 2C:
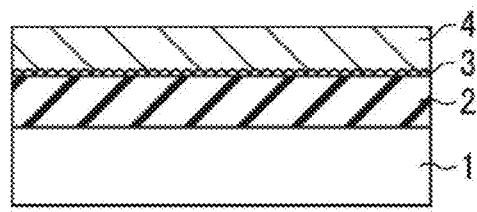

FIG. 1 is a flowchart illustrating one example of sequences of a silicon film forming method according to a first embodiment of the present disclosure. FIGS. 2A to 2C are sectional views schematically showing states of a workpiece during the sequences illustrated in FIG. 1.

First, a workpiece shown in FIG. 2A, e.g., a silicon substrate 1, is carried into a processing chamber of a film forming apparatus. A silicon oxide film 2 is previously formed on the silicon substrate 1. In this example, the surface of the silicon oxide film 2 is a processed surface on which a silicon film is formed. The silicon oxide film 2 may be any one of a natural oxide film, a thermal oxide film and a CVD film.

The processed surface is not limited to the silicon oxide film 2. For example, the silicon substrate 1 may be used as the processed surface. A silicon-containing material, e.g., a silicon film, a silicon nitride film, a silicon oxynitride film, a silicon carbide film or a silicon oxycarbonitride film may be used as the processed surface. In addition, an insulation film having a low dielectric constant or a metal film may be used as the processed surface.

Next, as shown in FIGS. 1 and 2B, a seed layer 3 is formed by having silicon adsorbed onto the surface (the processed surface) of the silicon oxide film 2. The seed layer 3 is formed by supplying a process gas, e.g., a high-order aminosilane-based gas containing two or more silicon atoms in a molecular formula thereof (hereinafter abbreviated as "high-order aminosilane-based gas"), onto the surface of the silicon oxide film 2. In addition, a process temperature used in forming the seed layer 3 is equal to or lower than 350 degrees C. and equal to or higher than a room temperature (25 degrees C.) (Step S1).

Examples of the high-order aminosilane-based gas include a silicon amino compound represented by a formula:

$$((R1R2)N)_n Si_x H_{2X+2-n-m}(R3)_m \quad (A); or$$

$$((R1R2)N)_n Si_x H_{2X-n-m}(R3)_m \quad (B).$$

In the formulas (A) and (B) above, n is the number of amino groups, which is a natural number of 1 to 6, m is the number of alkyl groups, which is zero or a natural number of 1 to 5, R1, R2, and R3 are $CH_3$, $C_2H_5$ and $C_3H_7$, R1, R2 and R3 may be identical with each other or may not be identical with each other, R3 may be Cl, and X is a natural number equal to or greater than two.

A gas containing at least one kind of the silicon amino compound represented by the formula (A) or (B) can be selected as the process gas used in Step S1.

Examples of the high-order aminosilane-based gas represented by the formula (A) include a gas containing at least one selected from a group including:

diisopropylaminodisilane ($Si_2H_5N(iPr)_2$);
diisopropylaminotrisilane ($Si_3H_7N(iPr)_2$);
diisopropylaminochlorodisilane ($Si_2H_4ClN(iPr)_2$); and
diisopropylaminochlorotrisilane ($Si_3H_6ClN(iPr)_2$).

Examples of the high-order aminosilane-based gas represented by the formula (B) include a gas containing at least one selected from a group including:

diisopropylaminocyclotrisilane ($Si_3H_5N(iPr)_2$); and diisopropylaminochlorocyclotrisilane ($Si_3H_4ClN(iPr)_2$).

In this example, diisopropylaminodisilane (hereinafter referred to as "DIPADS") represented by the formula (A) was used.

Examples of process conditions used in Step S1 are as follows:

DIPADS Flow Rate: 200 sccm
Process Time: 1 min
Process Temperature: 250 degrees C.
Process Pressure: 133 Pa (1 Torr)

Subsequently, as shown in FIGS. 1 and 2C, a silicon film 4 is formed by depositing silicon on the seed layer 3 (Step S2). The silicon film 4 is formed by supplying a process gas, e.g., a silane-based gas not containing an amino group, onto the surface of the seed layer 3. The silicon film 4 thus formed is, e.g., amorphous silicon.

Examples of the silane-based gas not containing an amino group include silicon hydride represented by a formula:

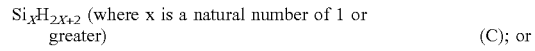

$$Si_xH_{2X+2} \text{ (where x is a natural number of 1 or greater)} \quad (C); or$$

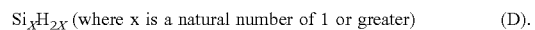

$$Si_xH_{2X} \text{ (where x is a natural number of 1 or greater)} \quad (D).$$

A gas containing at least one kind of the silicon hydride represented by the formula (C) or (D) can be selected as the process gas (silicon source gas) used in Step S2.

Examples of the silicon hydride represented by the formula (C) include:

monosilane ($SiH_4$);
disilane ($Si_2H_6$);
trisilane ($Si_3H_8$);
tetrasilane ($Si_4H_{10}$);
pentasilane ($Si_5H_{12}$);
hexasilane ($Si_6H_{14}$); and
heptasilane ($Si_7H_{16}$). The process gas used in Step S2 can be selected from at least one of the above examples.

Examples of the silicon hydride represented by the formula (D) include:

cyclotrisilane ($Si_3H_6$);
cyclotetrasilane ($Si_4H_8$);
cyclopentasilane ($Si_5H_{10}$);
cyclohexasilane ($Si_6H_{12}$); and
cycloheptasilane ($Si_7H_{14}$).

The process gas used in Step S2 can be selected from at least one of the above examples.

In this example, monosilane ($SiH_4$) represented by the formula (C) was used.

Examples of process conditions used in Step S2 are as follows:

$SiH_4$ Flow Rate: 500 sccm
Deposition Time: 10 min
Deposition Temperature: 510 degrees C.
Deposition Pressure: 53.2 Pa (0.4 Torr)

As described above, in the silicon film forming method according to the first embodiment, the seed layer 3 is formed by supplying the high-order aminosilane-based gas onto the surface (the processed surface) of the silicon oxide film 2 and having silicon adsorbed onto the surface of the silicon oxide film 2 (Step S1). Then, the silicon film 4 is formed by supplying the silane-based gas not containing an amino group onto the seed layer 3 and depositing silicon on the seed layer 3 (Step S2).

Moreover, in the silicon film forming method according to the first embodiment, the process temperature used in Step S1 is set equal to or lower than 350 degrees C. and equal to or higher than a room temperature (25 degrees C.). This in some embodiments provides advantages that will be described below.

<Relationship Between a Process Temperature and a Reaction Mode>

First, description will be made on a relationship between a process temperature and a reaction mode of the silicon film formed by the high-order aminosilane-based gas.

Figure 3:
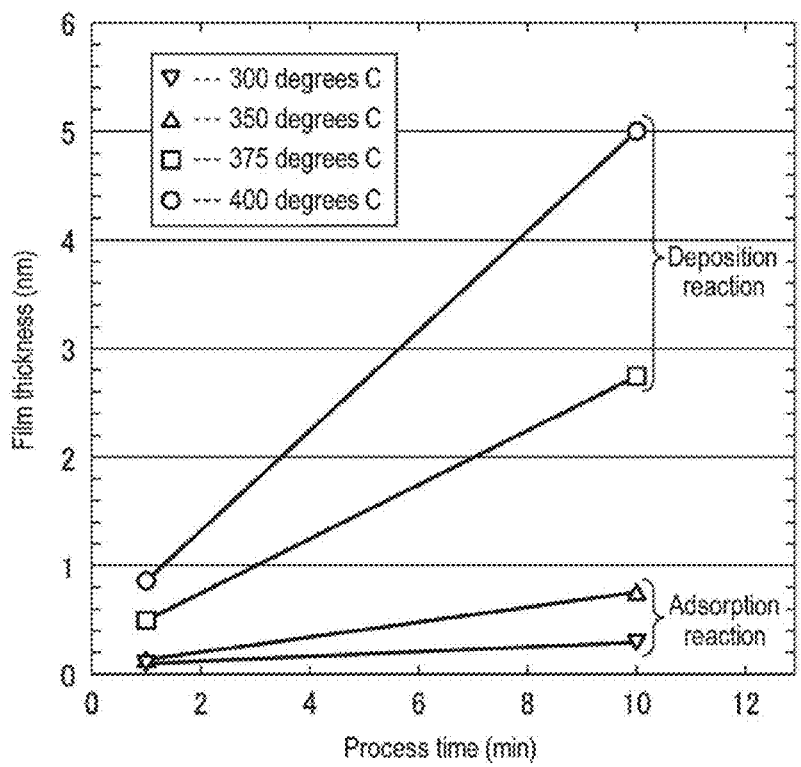
FIG. 3 is a view showing a relationship between a process time and a film thickness.

FIG. 3 is a view showing a relationship between a process time and a film thickness. In FIG. 3, the vertical axis indicates a film thickness of the silicon film formed by the high-order aminosilane-based gas, and the horizontal axis indicates a process time. The relationship shown in FIG. 3 was found by the following process conditions.

Process Gas: DIPADS
Process Gas Flow Rate: 200 sccm
Process Temperature: 300 degrees C., 350 degrees C., 375 degrees C. and 400 degrees C.
Process Time: 1 min or 10 min
Process Pressure: 133 Pa (1 Torr)

As shown in FIG. 3, if the process time is prolonged from 1 min to 10 min, the thickness of the silicon film becomes larger. However, it was found that, even if the difference in process temperature between 350 degrees C. and 375 degrees C. is no more than 25 degrees C., a growth rate becomes extremely large. It is presumed that, if the process temperature is 350 degrees C. or less, the reaction mode becomes an adsorption reaction and not a deposition reaction (CVD reaction). Further, it is presumed that, if the process temperature exceeds 350 degrees C., the reaction mode is changed from an adsorption reaction to a deposition reaction. Thus, the present inventors have conducted a more detailed analysis on the change of the reaction mode by reducing the flow rate of DIPADS.

Figure 4:
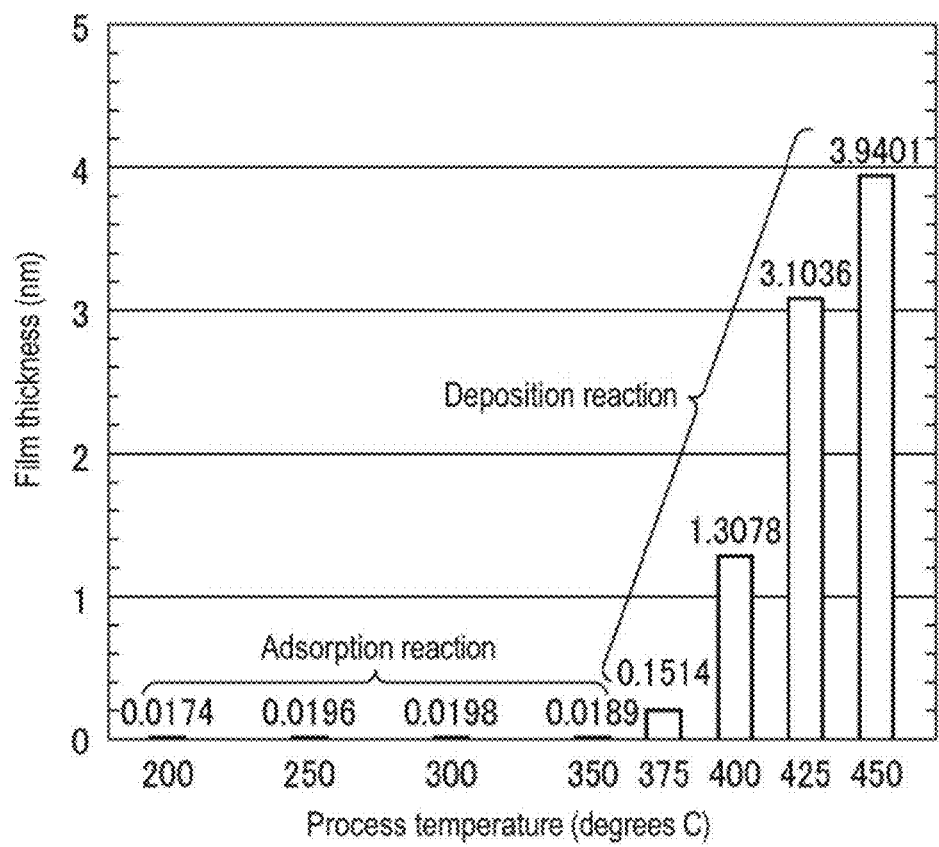
FIG. 4 is a view showing a relationship between a process temperature and a film thickness.

FIG. 4 is a view showing a relationship between a process time and a film thickness. The relationship shown in FIG. 4 was found by the following process conditions.

Process Gas: DIPADS
Process Gas Flow Rate: 50 sccm
Process Temperature: 200 degrees C., 250 degrees C., 300 degrees C., 350 degrees C., 375 degrees C., 400 degrees C., 425 degrees C. and 450 degrees C.
Process Time: 10 min
Process Pressure: 133 Pa (1 Torr)

As shown in FIG. 4, it was found that, even when the flow rate of DIPADS is reduced to 50 sccm, the film thickness of the silicon film tends to grow larger from between the process temperatures 350 degrees C. and 375 degrees C., just like a case where the flow rate of DIPADS is 200 sccm.

Figure 5:
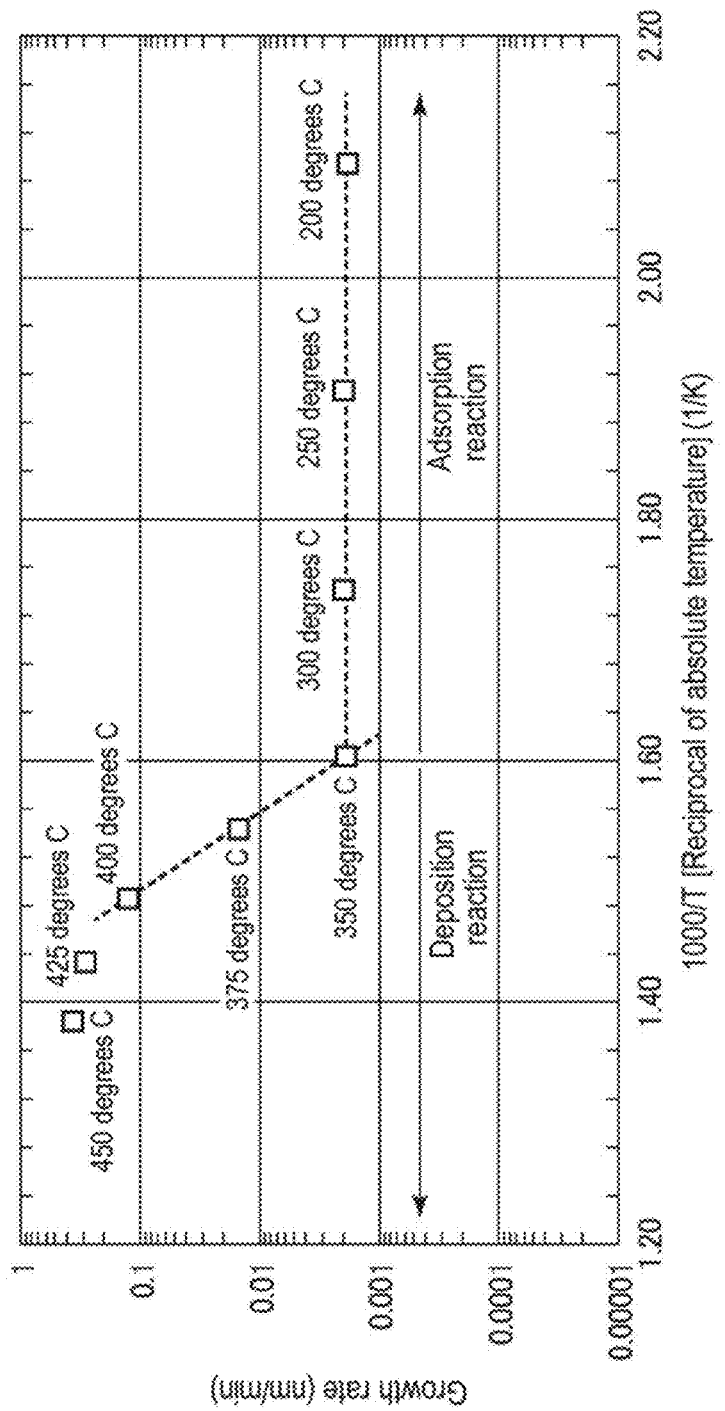
FIG. 5 is a view where the relationship shown in FIG. 4 is depicted in an Arrhenius plot.

FIG. 5 is a view where the relationship shown in FIG. 4 is depicted by an Arrhenius plot. As shown in FIG. 5, in a region where the process temperature is 350 degrees C. or less, a slope hardly appears in the Arrhenius plot. That is to say, DIPADS is not activated. If the process temperature exceeds 350 degrees C., a slope appears in the Arrhenius plot. In other words, DIPADS is activated.

From the relationship shown in FIG. 5, it was confirmed that the reaction mode of DIPADS becomes an adsorption reaction in the region where the process temperature is 350 degrees C. or less, and the reaction mode of DIPADS becomes a deposition reaction in the region where the process temperature exceeds 350 degrees C. The present disclosure is effective in forming the seed layer 3. The seed layer 3 does not require a large film thickness. For that reason, it is only necessary that the seed layer 3 is formed by having silicon adsorbed onto the processed surface. Accordingly, from the view that the seed layer 3 is formed by a silicon adsorption reaction using a high-order aminosilane-based gas, it is preferred in some embodiments that the process temperature be equal to or lower than 350 degrees C. and equal to or higher than a room temperature (25 degrees C.).

As described above, when the seed layer 3 is formed by using the high-order aminosilane-based gas, the process temperature is set equal to or lower than 350 degrees C. and equal to or higher than a room temperature (25 degrees C.). Therefore, the seed layer 3 thus formed can be obtained by having silicon adsorbed onto the processed surface. This makes it possible to obtain an advantage of the reduced thickness of the seed layer 3.

<Seed Effect in a Region where the Process Temperature is 350 Degrees C. or Less>

Next, description will be made on a seed effect in a region where the process temperature is 350 degrees C. or less.

<1. Relationship Between the Process Temperature of the Seed Layer 3 and the Film Thickness of the Silicon Film 4>

After setting the process conditions as follows, a seed layer 3 was formed using the process temperature as a parameter (Step S1). Then, by fixing the process conditions, a silicon film 4 was formed on the seed layer 3 (Step S2). The film thickness of the silicon film 4 thus formed was compared.

Step S1
DIPADS Flow Rate: 200 sccm
Process Time: 1 min
Process Temperature: 350 degrees C.→300 degrees C.→250 degrees C.→200 degrees C.
Process Pressure: 133 Pa (1 Torr)
Step S2
$SiH_4$ Flow Rate: 500 sccm
Deposition Time: 10 min
Deposition Temperature: 510 degrees C.
Deposition Pressure: 53.2 Pa (0.4 Torr)

Figure 6:
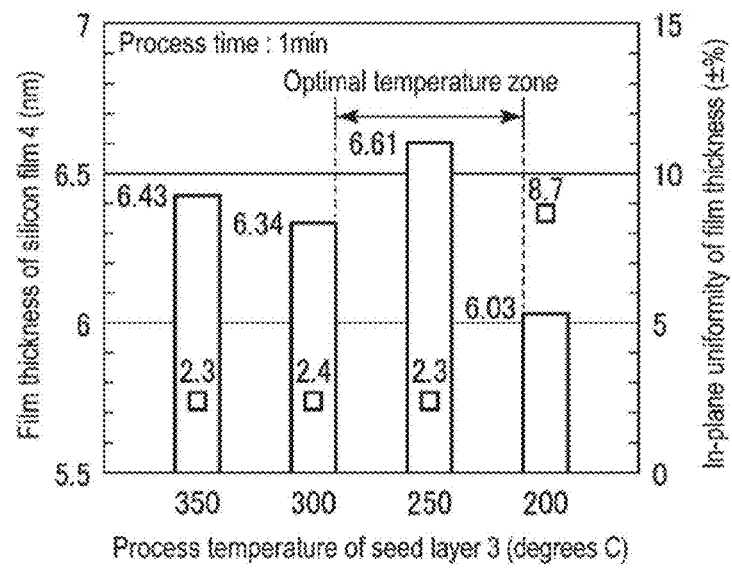
FIG. 6 is a view showing a relationship between a process temperature of a seed layer and a film thickness of a silicon film formed on the seed layer.

The results are shown in FIG. 6. FIG. 6 is a view showing a relationship between the process temperature of the seed layer 3 and the film thickness of the silicon film 4 formed on the seed layer 3. Typically, it was expected that the effect of the seed layer 3 would become smaller, if the process temperature were reduced during the formation of the seed layer 3. However, as shown in FIG. 6, the results were contrary to the expectation.

As shown in FIG. 6, if the process temperature of the seed layer 3 is reduced from 350 degrees C. to 300 degrees C., the film thickness of the silicon film 4 formed on the seed layer 3 is decreased from about 6.43 nm to about 6.34 nm. However, if the process temperature of the seed layer 3 is reduced from 300 degrees C. to 250 degrees C., the film thickness of the silicon film 4 is increased on the contrary. Moreover, the film thickness exceeds the aforementioned film thickness of about 6.43 nm at the process temperature 350 degrees C. and then reaches about 6.61 nm. If the process temperature of the seed layer 3 is reduced from 250 degrees C. to 200 degrees C., the film thickness is decreased to about 6.03 nm. In case where the process temperature is 200 degrees C., the in-plane uniformity of the film thickness is 8.7% which is a greater deviation. However, in general the in-plane uniformity of the film thickness falls within a practically usable range.

From the above observation, it was confirmed that, when the seed layer 3 is formed using the high-order aminosilane-based gas, the optimal temperature zone where silicon can be efficiently adsorbed onto the processed surface exists between a process temperature less than 300 degrees C. and a process temperature higher than 200 degrees C. To verify this confirmation, the pressure dependency of film thickness of the silicon film 4 was investigated. If the optimal temperature zone is used, a substantially perfectly adsorbed seed layer 3 arranged with high density silicon on the processed surface will be formed without resort to the process pressure. It is assumed that, if the substantially perfectly adsorbed seed layer 3 is formed, no large change will occur in the film thickness of the silicon film 4 formed on the seed layer 3.

Hence, it is assumed that the film thickness of the silicon film 4 would not depend on the pressure.

<2. Relationship Between the Process Pressure of the Seed Layer 3 and the Film Thickness of the Silicon Film 4>

After setting the process conditions as follows, a seed layer 3 was formed by using the process pressure as a parameter (Step S1). Then, a silicon film 4 was formed on the seed layer 3 by fixing the process conditions (Step S2). The film thickness of the silicon film 4 thus formed was compared.

Step S1
DIPADS Flow Rate: 200 sccm
Process Time: 1 min
Process Temperature: 300 degrees C. or 250 degrees C.
Process Pressure: 133 Pa (1 Torr)→66.5 Pa (0.5 Torr)→13.3 Pa (0.1 Torr)
Step S2 (the Conditions Remain Unchanged)

Figure 7:
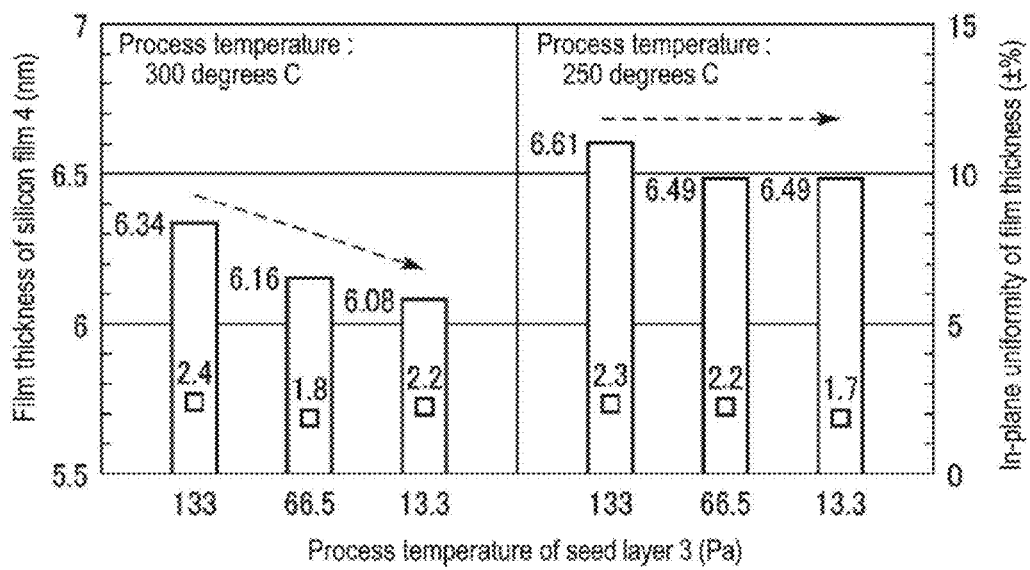
FIG. 7 is a view showing a relationship between a process pressure of a seed layer and a film thickness of a silicon film formed on the seed layer.

The results are shown in FIG. 7. FIG. 7 is a view showing a relationship between the process pressure of the seed layer 3 and the film thickness of the silicon film 4 formed on the seed layer 3.

<(a) A Case where the Process Time of the Seed Layer 3 is 1 Min and the Process Temperature is 300 Degrees C.>

As shown in FIG. 7, it was confirmed that the film thickness of the silicon film 4 tends to decrease as the process pressure is decreased. If the process time is 1 min and the process temperature is 300 degrees C., it is presumed that the density of silicon arranged on the processed surface is relatively low so that the seed layer 3 would not be formed by perfect adsorption. Moreover, the in-plane uniformity of the film thickness falls within a practically usable range.

<(b) a Case where the Process Time of the Seed Layer 3 is 1 min and the Process Temperature is 250 Degrees C.>

As shown in FIG. 7, the film thickness of the silicon film 4 slightly decreases as the process pressure is decreased. However, it was confirmed that, as compared to the case where the process temperature is 300 degrees C., the decreased amount of the film thickness of the silicon film 4 is smaller and substantially flat as well. From this result, if the process time of the seed layer 3 is 1 min, the case where the process temperature is 250 degrees C., rather than 300 degrees C., is assumed to have high density silicon arranged on the processed surface. Thus, it is presumed that the seed layer 3 is formed in a state closer to perfect adsorption. Moreover, the in-plane uniformity of the film thickness falls within a practically usable range.

<3. Relationship Between the Process Pressure of the Seed Layer 3 and the Haze of the Silicon Film 4>

To verify whether the seed layer 3 is formed in a state closer to perfect adsorption, the surface haze of the silicon film 4 at the six samples was investigated. This investigation is based on an assumption that, if high density silicon is arranged on the processed surface and if the seed layer 3 is formed in a state closer to perfect adsorption, fine irregularities on the surface of the silicon film 4 formed thereon will become smaller. Thus, it is assumed that satisfactory haze will be observed.

Figure 8:
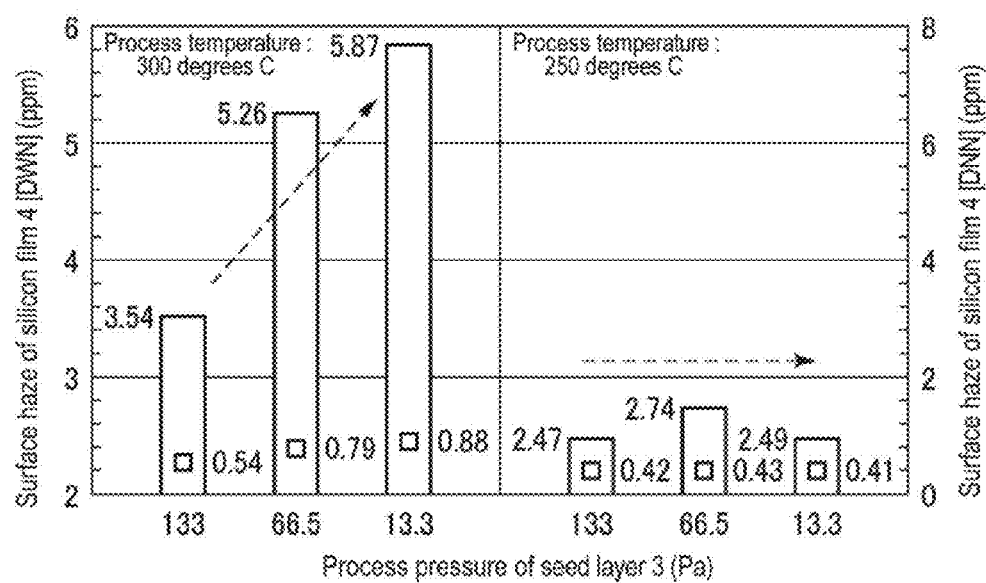
FIG. 8 is a view showing a relationship between a process pressure of a seed layer and a surface haze of a silicon film formed on the seed layer.
Figure 9A:
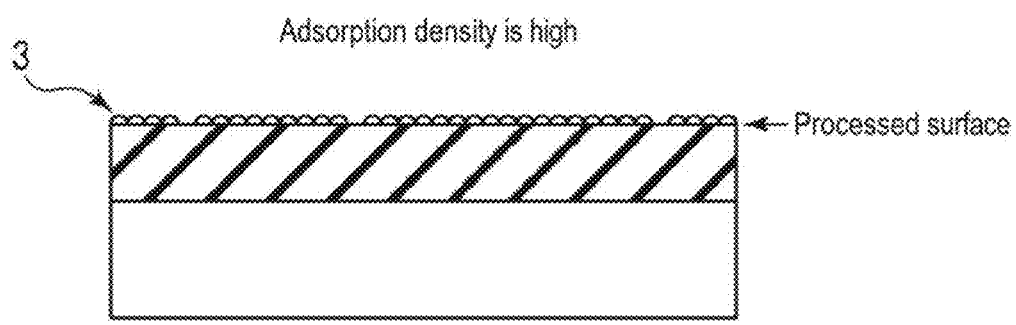
FIG. 9A is a sectional view illustrating a case where an adsorption density of silicon is high.

FIG. 8 is a view showing a relationship between the process pressure of the seed layer 3 and the surface haze of the silicon film 4 formed on the seed layer 3. As shown in FIG. 8, if the process time of the seed layer 3 is 1 min, a more satisfactory haze was observed when the process temperature is 250 degrees C., rather than 300 degrees C. If the process temperature is 250 degrees C., as shown in FIG. 9A, the adsorption density of silicon per unit time (per 1 min in this example) on the processed surface becomes higher and the seed layer 3 comes into a state closer to perfect adsorption. Accordingly, it can be presumed that fine irregularities on the surface of the silicon film 4 formed on the seed layer 3 become smaller and thus, the surface roughness of the silicon film 4 would be improved.

Figure 9B:
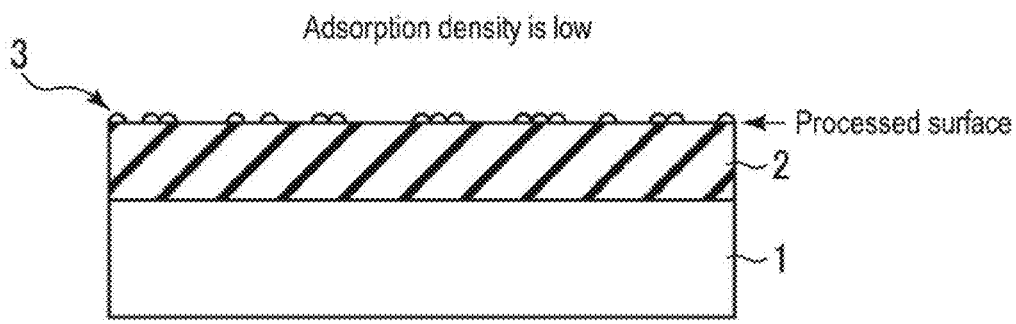
FIG. 9B is a sectional view illustrating a case where an adsorption density of silicon is low.

In contrast, if the process temperature is 300 degrees C., the film thickness of the silicon film 4 is reduced and deterioration of the haze is observed. It is presumed that, if the process pressure decreases, as shown in FIG. 9B, the adsorption density of silicon per unit time (per 1 min in this example) on the processed surface becomes lower than the case where the process temperature is 250 degrees C. Thus, it is presumed that the seed layer 3 having a relatively large number of pinholes or voids is formed.

As described above, in the process of using the high-order aminosilane-based gas, an optimal temperature zone exists, in which silicon can be efficiently adsorbed onto the processed surface, in a region having a process temperature of 350 degrees C. or less where the reaction mode becomes an adsorption reaction. In this example, the optimal temperature zone exists at a process temperature between less than 300 degrees C. and higher than 200 degrees C.

Thus, if the process of using the high-order aminosilane-based gas is performed at the optimal temperature zone, it is possible to efficiently form a layer, e.g., to form a high-quality seed layer 3 at a low temperature and within a short period of time. In addition, in the optimal temperature zone, a particularly preferable temperature range for some embodiments is a range where the process temperature is less than 250±25 degrees C.

<4. Relationship Between the Process Time of the Seed Layer 3 and the Film Thickness of the Silicon Film 4>

As described so far, it was found that, when the seed layer 3 is formed using the high-order aminosilane-based gas, an optimal temperature zone exists in having silicon adsorbed onto the processed surface, at a region where the process temperature is 350 degrees C. or less. If the optimal temperature zone is used, it is possible to obtain a high-quality seed layer 3 having a high silicon adsorption density within a short period of time. Moreover, the optimal temperature zone does not largely depend on the process pressure. The optimal temperature zone is a range of a process temperature between less than 300 degrees C. and higher than 200 degrees C. In this range, a process temperature of 250 degrees C. or so is satisfactory. In addition, if the process temperature is within a range of less than 250±25 degrees C., it would be possible to obtain the same advantage as when the process temperature is 250 degrees C.

Depending on the process, with a view to performing the process at a lower temperature, there is a need to make the process temperature of the seed layer 3 lower than the process temperature range of less than 250±25 degrees C.

Conversely, with a view to enhancing throughput, there is a need to make the process temperature of the seed layer 3 higher than the process temperature range of less than 250±25 degrees C., such that the process temperature of the seed layer 3 comes closer to the process temperature used during a film forming process. This is to narrow a control range of the process temperature, thereby shortening the time required for raising or lowering a temperature.

Thus, the relationship between the process time of the seed layer 3 and the film thickness of the silicon film 4 was further investigated.

Step S1
DIPADS Flow Rate: 200 sccm
Process Time: 1 min→3 min→5 min→10 min
Process Temperature: 300 degrees C. or 250 degrees C. or 200 degrees C.

Process Pressure: 133 Pa (1 Torr)

Step S2 (the Conditions Remain Unchanged)

Figure 10:
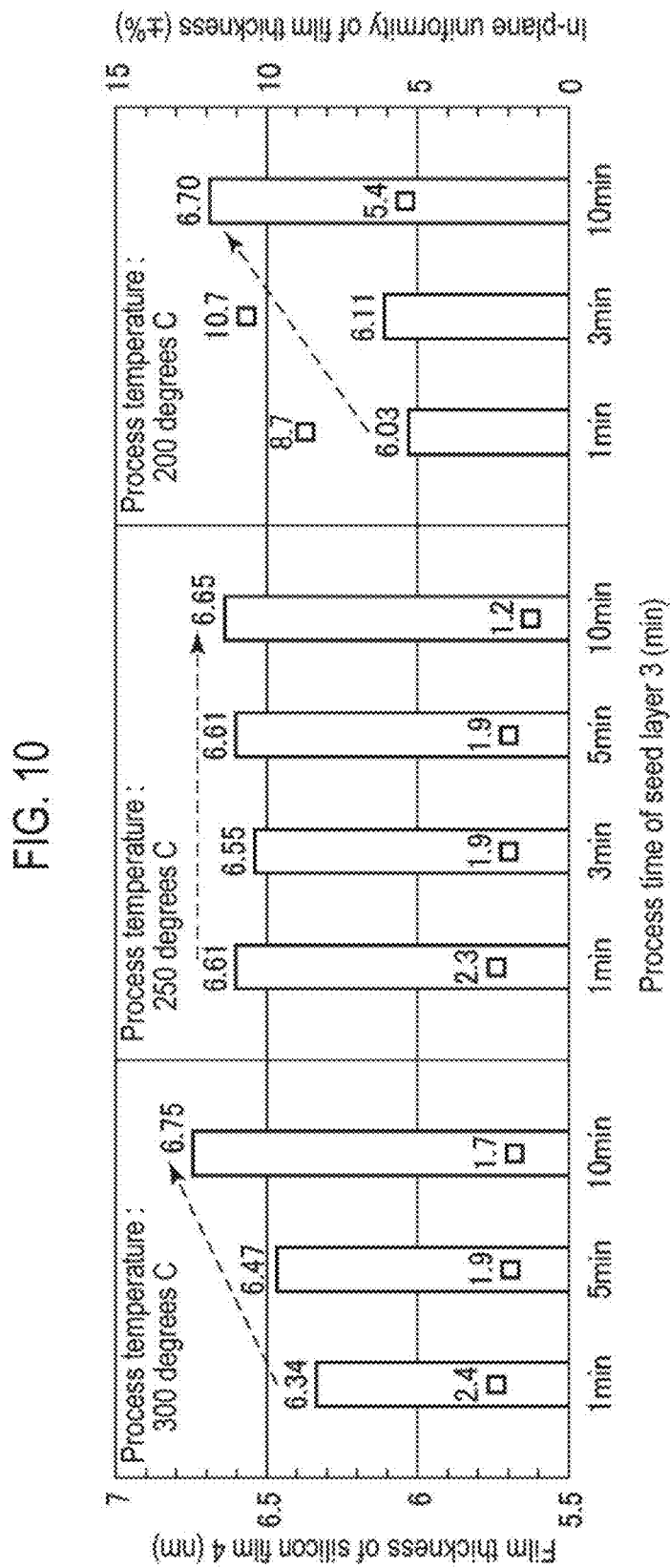
FIG. 10 is a view showing a relationship between a process time of a seed layer and a film thickness of a silicon film formed on the seed layer.

The results are shown in FIG. 10. FIG. 10 is a view showing a relationship between the process time of the seed layer 3 and the film thickness of the silicon film 4 formed on the seed layer 3.

<A Case where the Process Temperature is 300 Degrees C.>

As shown in FIG. 10, the film thickness of the silicon film 4 tends to increase as the process time of the seed layer 3 is prolonged from 1 min to 5 min and 10 min.

<A Case where the Process Temperature is 250 Degrees C.>

As shown in FIG. 10, the film thickness of the silicon film 4 remains substantially flat even if the process time of the seed layer 3 is prolonged from 1 min to 3 min, 5 min and 10 min.

<A Case where the Process Temperature is 200 Degrees C.>

As shown in FIG. 10, the film thickness of the silicon film 4 tends to increase as the process time of the seed layer 3 is prolonged from 1 min to 3 min and 10 min.

Figure 11:
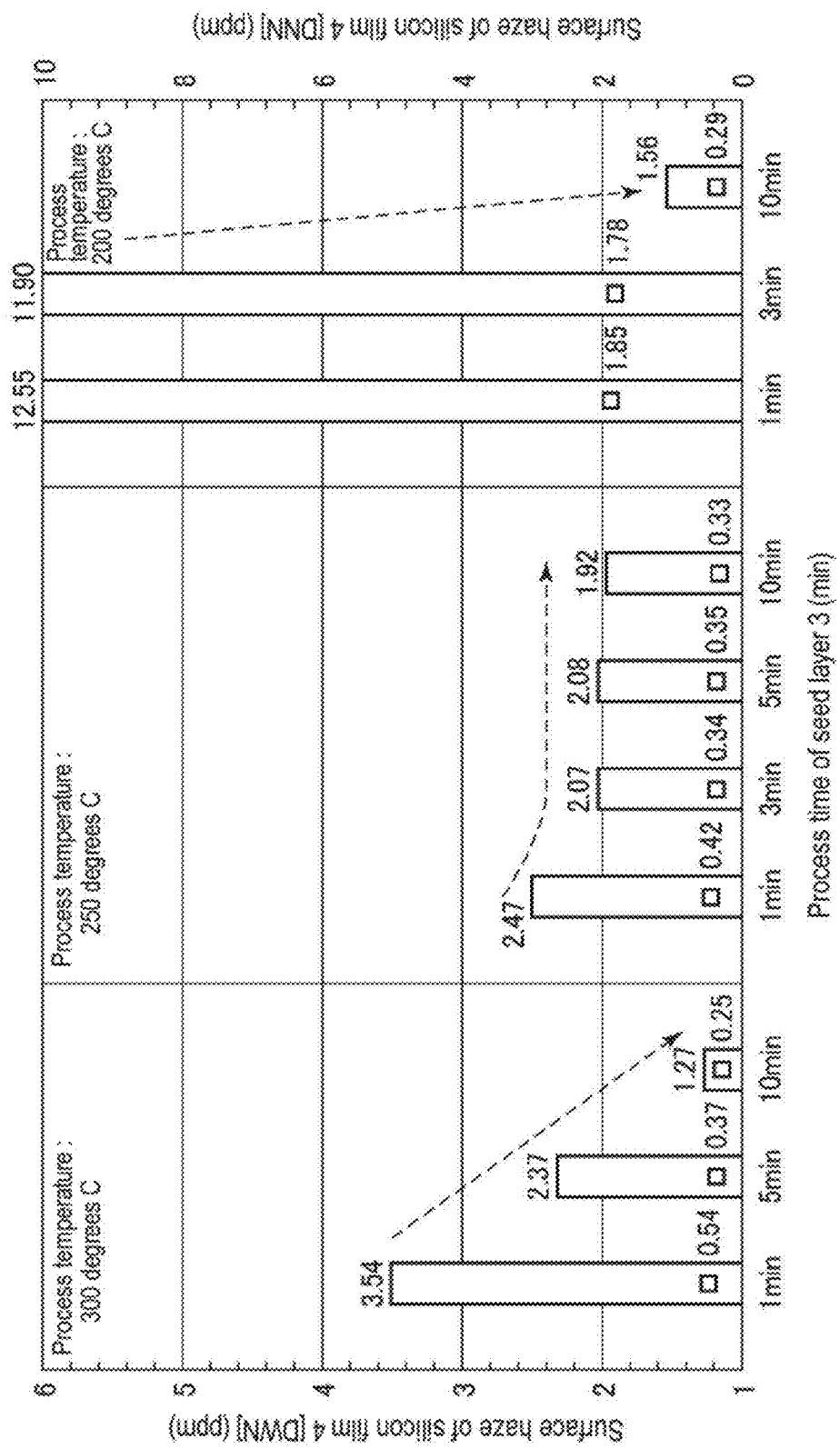
FIG. 11 is a view showing a relationship between a process time of a seed layer and a surface haze of a silicon film formed on the seed layer.

The surface haze of the silicon film 4 at the samples shown in FIG. 10 was investigated. FIG. 11 is a view showing a relationship between the process time of the seed layer 3 and the surface haze of the silicon film 4 formed on the seed layer 3.

<A Case where the Process Temperature is 300 Degrees C.>

As shown in FIG. 11, the surface haze of the silicon film 4 tends to be improved as the process time of the seed layer 3 is prolonged from 1 min to 5 min and 10 min.

<A Case where the Process Temperature is 250 Degrees C.>

As shown in FIG. 11, if the process time of the seed layer 3 is prolonged from 1 min to 3 min, 5 min and 10 min, the surface haze of the silicon film 4 tends to be improved when the process time is changed from 1 min to 3 min. However, the surface haze of the silicon film 4 remains substantially flat at 3 min, 5 min and 10 min.

<A Case where the Process Temperature is 200 Degrees C.>

As shown in FIG. 11, if the process time of the seed layer 3 is prolonged from 1 min to 3 min and 10 min, the surface haze of the silicon film 4 tends to be improved. In the process time of 1 min or 3 min, a practically unusable value is generated. However, if the process time is set longer than 3 min, a practically usable value is recovered.

From the above results, if one wishes to make the process temperature equal to or higher than 300 degrees C. and equal to or lower than 350 degrees C., the seed layer 3 having a practically sufficient level can be obtained by setting the process time of the seed layer 3 to a finite value of 5 min or higher.

If one wishes to make the process temperature equal to or lower than 200 degrees C. and equal to or higher than a room temperature (25 degrees C.), the seed layer 3 having a practically sufficient level can be obtained by setting the process time of the seed layer 3 to a finite value of 3 min or higher.

<As for a Source Gas of the Silicon Film 4>

Next, description will be made on a source gas of the silicon film 4 formed on the seed layer 3. The silicon film 4 is formed on the seed layer 3. A practically usable minimum film thickness exists for the film thickness of the silicon film 4. The practically usable minimum film thickness means a film thickness at which a pinhole is not generated, even if the film thickness is made small. The minimum film thickness depends on the source gas of the silicon film 4. For example, the source gas is a monosilane gas which does not contain an amino group or a high-order silane-based gas which has an order equal to or higher than disilane and which does not contain an amino group.

<A Case where the Source Gas of the Silicon Film 4 is a Monosilane Gas>

FIG. 12 is a photograph showing a secondary electron image of the surface of the silicon film when a monosilane gas is used as the source gas. In FIG. 12, there are respectively shown a case where the seed layer 3 is not formed (no seed layer), a case where the seed layer 3 is formed by using an aminosilane-based gas containing one silicon atom in a molecular formula (aminosilane seed) and a case where the seed layer 3 is formed by using a high-order aminosilane-based gas (high-order aminosilane seed).

As shown in FIG. 12, if the source gas of the silicon film 4 is a monosilane gas, the minimum film thickness of the silicon film 4 that is practically usable without generating a pinhole is:

15 nm order in case of no seed layer;

8 nm order in case of aminosilane seed; and 6 nm order in case of high-order aminosilane seed.

<A Case where the Source Gas of the Silicon Film 4 is a High-Order Silane-Based Gas>

FIG. 13 is a photograph showing a secondary electron image of the surface of the silicon film 4 when a high-order silane-based gas is used as the source gas.

As shown in FIG. 13, when the source gas of the silicon film 4 is a high-order silane-based gas, e.g., disilane, the minimum film thickness of the silicon film 4 that is practically usable without generating a pinhole is:

4 nm order in case of no seed layer;

3 nm order in case of aminosilane seed; and 2 nm order in case of high-order aminosilane seed.

As shown in FIGS. 12 and 13, if one wishes to reduce the film thickness of the silicon film 4, a high-order silane-based gas having an order equal to or higher than disilane may be used as the source gas of the silicon film 4. Needless to say, if a large film thickness is required for the silicon film 4, it is possible to use a monosilane gas. For example, in the case where a pinhole is permissible in the process, it is possible to set the film thickness of the silicon film 4 to a finite value of less than 2 nm, if a high-order silane-based gas is used as the source gas of the silicon film 4. Furthermore, it is possible to set the film thickness of the silicon film 4 to a finite value of less than 6 nm, if a monosilane gas is used as the source gas of the silicon film 4. In these cases, a pinhole would be generated. However, as compared with a case where a seed layer is absent, it is possible to obtain an advantage of improving the surface roughness.

As described above, depending on the film thickness required for the silicon film 4, it may be selected as the source gas of the silicon film 4 from a monosilane gas which does not contain an amino group and a high-order silane-based gas which does not contain an amino group and has an order equal to or higher than disilane.

Examples of the high-order silane-based gas which have an order equal to or higher than disilane and which do not contain an amino group may include a gas containing at least one selected from a group including:

disilane ($Si_2H_6$);

silicon hydride which is represented by the formula $Si_nH_{2n}$ (wherein m is a natural number equal to or greater than 3); and silicon hydride which is represented by the formula $Si_nH_{2n}$ (wherein n is a natural number equal to or greater than 3).

Examples of the silicon hydride represented by the formula $Si_mH_{2m+2}$ (wherein m is a natural number equal to or greater than 3) may include at least one selected from a group including:

$Si_3H_8$;
$Si_4H_{10}$;
$Si_5H_{12}$;
$Si_6H_{14}$; and
$Si_7H_{16}$.

In addition, examples of the silicon hydride represented by the formula $Si_nH_{2n}$ (wherein n is a natural number equal to or greater than 3) may include at least one selected from a group including:

$Si_3H_6$;
$Si_4H_8$;
$Si_5H_{10}$;
$Si_6H_{12}$; and
$Si_7H_{14}$.

From the results shown in FIGS. 12 and 13, it can be understood that, in forming the silicon film 4 it is more preferable in some embodiments to form the seed layer 3 than not to form the seed layer 3. This is because it becomes possible to suppress generation of a pinhole at the silicon film 4. It can also be understood that, as the process gas used in forming the seed layer 3, it is more preferable in some embodiments to use a high-order aminosilane-based gas containing two or more silicon atoms in a molecular formula than to use an aminosilane-based gas containing only one silicon atom in a molecular formula. This is because it becomes possible to further suppress generation of a pinhole at the silicon film 4.

Second Embodiment

In the first embodiment, it is described that, if one wishes to reduce the film thickness of the silicon film 4 formed on the seed layer 3, it is desirable in some embodiments to select as the source gas a high-order silane-based gas which has an order equal to or higher than disilane and which does not contain an amino group.

The second embodiment includes application examples for a case where a high-order silane-based gas, which has an order equal to or higher than disilane and which does not contain an amino group (hereinafter abbreviated as "high-order silane-based gas"), is selected as the source gas of the silicon film formed on the seed layer 3.

Application Example 1: Multiple Seed Layers

In the case where a high-order silane-based gas is used as the source gas of the silicon film formed on the seed layer 3, it becomes possible to form a thin silicon film having generation of a pinhole suppressed. This is effective when the seed layer 3 is formed into multiple seed layers.

Figure 14:
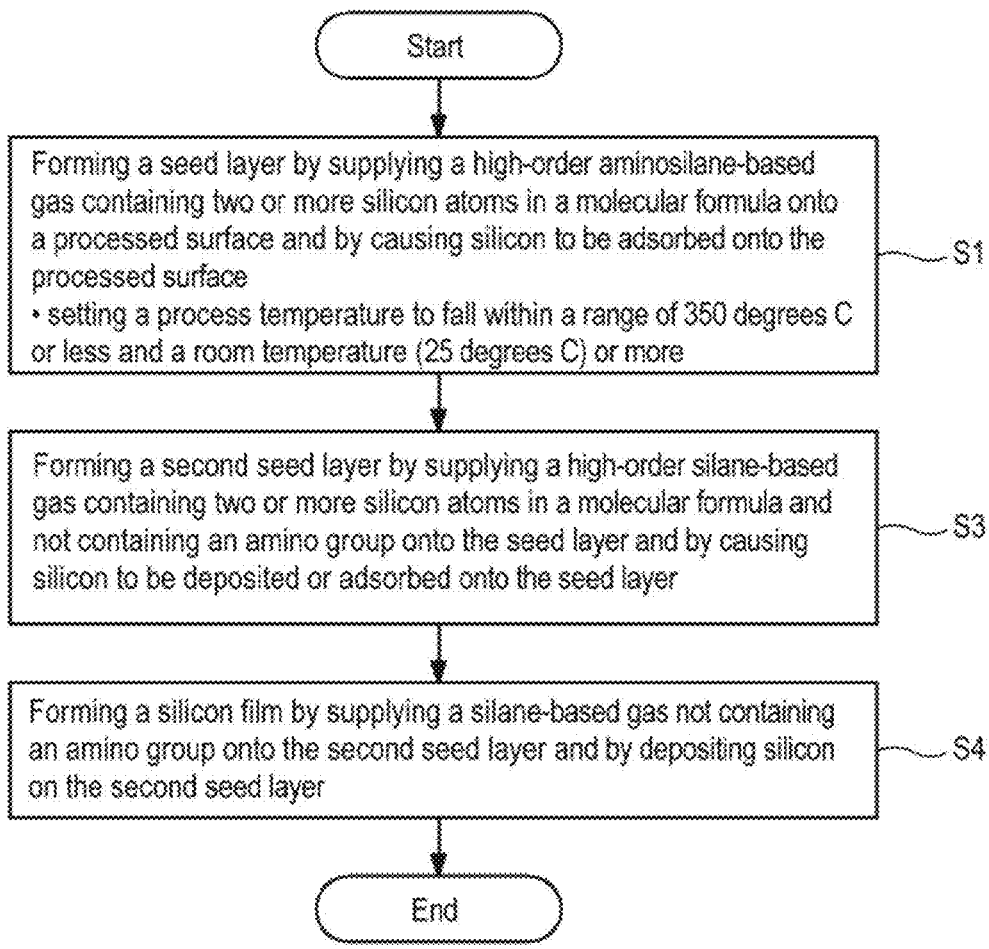
FIG. 14 is a flowchart illustrating one example of sequences on application example 1 of a silicon film forming method according to a second embodiment of the present disclosure.

FIG. 14 is a flowchart illustrating one example of sequences on application example 1 of a silicon film forming method according to a second embodiment of the present disclosure. FIGS. 15A to 15D are sectional views schematically showing states of a workpiece during the sequences illustrated in FIG. 14.

Figure 15A:
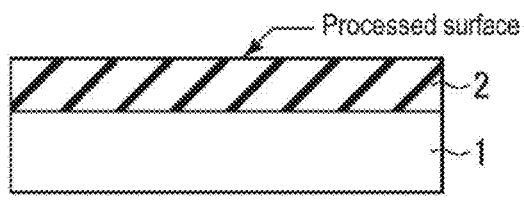
FIGS. 15A to 15D are sectional views schematically showing states of a workpiece during the sequences illustrated in FIG. 14.

First, a workpiece shown in FIG. 15A, e.g., a silicon substrate 1, is carried into a processing chamber of a film forming apparatus. The workpiece shown in FIG. 15A is identical to the workpiece illustrated in FIG. 2A. On the silicon substrate 1, a silicon oxide film 2 is formed. The surface of the silicon oxide film 2 becomes a processed surface on which a silicon film is formed. In the same manner as the first embodiment, the material that constitutes the processed surface is not limited to the silicon oxide film 2.

Figure 15B:

Then, as shown in FIGS. 14 and 15B, a seed layer 3 is formed by having silicon adsorbed onto the surface (processed surface) of the silicon oxide film 2. In the same manner as the first embodiment, the seed layer 3 is formed by supplying a high-order aminosilane-based gas as a process gas onto the surface of the silicon oxide film 2. The process temperature used when forming the seed layer 3 is equal to or lower than 350 degrees C. and equal to or higher than a room temperature (25 degrees C.) (Step S1). For the high-order aminosilane-based gas, it is possible to select a process gas described in Step S1 of the first embodiment. In this example, DIPADS was used. Process conditions may be the same as the conditions described in Step S1 of the first embodiment.

Figure 15C:
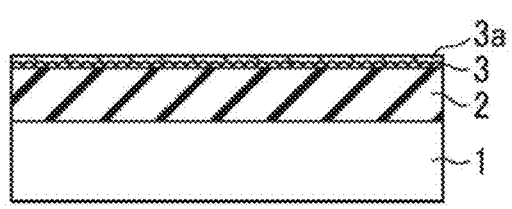

Subsequently, as shown in FIGS. 14 and 15C, a second seed layer 3a is formed by depositing silicon on the seed layer 3 (Step S3). The second seed layer 3a is formed by supplying, as a process gas, a high-order silane-based gas which has an order equal to or higher than disilane and which does not contain an amino group. In this example, disilane was used as the process gas of the second seed layer 3a. The film thickness of the second seed layer 3a is preferably set, as shown in FIG. 13, about equal to the minimum film thickness at which the generation of a pin hole is suppressed, e.g., within a range of from a 2 nm order to a 4 nm order. In this example, the film thickness of the second seed layer 3a was set equal to a 2 nm order (equal to or greater than 2 nm and less than 3 nm). For the process conditions, e.g., a deposition time may be controlled such that the film thickness of the second seed layer 3a becomes a 2 nm order. One example of the process conditions used in Step S3 is as follows.

$Si_2H_6$ Flow Rate: 300 sccm
Deposition Time: 16 min
Deposition Temperature: 400 degrees C.
Deposition Pressure: 133 Pa (1 Torr)

However, e.g., in the case where a pinhole is permissible in the process, the film thickness of the second seed layer 3a need not be set equal to or greater than 2 nm and equal to or smaller than 4 nm. The film thickness of the second seed layer 3a may also be set to a finite value of 4 nm or less.

Figure 15D:
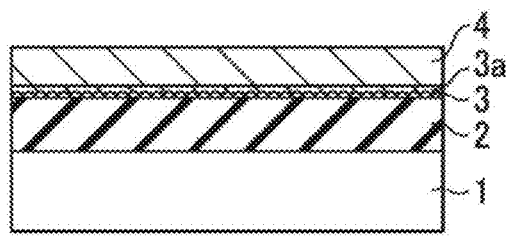

Next, as shown in FIGS. 14 and 15D, a silicon film 4 is formed by depositing silicon on the second seed layer 3a (Step S4). The silicon film 4 is formed by supplying, as a process gas, a silane-based gas not containing an amino group onto the surface of the second seed layer 3a. For the silane-based gas not containing an amino group, it is possible to select a process gas described in Step S2 of the first embodiment. In this example, a monosilane gas was used. In addition, in this example, process conditions may be the same as the conditions described in Step S2 of the first embodiment. The silicon film 4 thus formed is, e.g., an amorphous silicon film. Needless to say, a high-order silane-based gas, which has an order equal to or higher than disilane and does not contain an amino group, may be used as the process gas of the silicon film 4. In this case, for the high-order silane-based gas which has an order equal to or higher than disilane and which does not contain an amino group, it is desirable to use a silane-based gas having an order equal to or lower than the high-order silane-based gas used as the process gas of the second seed layer 3a, the high-order silane-based gas having an order equal to or higher than disilane and not containing an amino group. For example, if disilane ($Si_2H_6$) is used as the process gas of the second seed layer 3a, it is preferred in some embodiments that disilane (Si$_2$H$_6$) or monosilane (SiH$_4$) is used as the process gas of the silicon film 4. In addition, e.g., if trisilane (Si$_3$H$_8$) is used as the process gas of the second seed layer 3a, it is preferred in some embodiments that trisilane (Si$_3$H$_8$), disilane (Si$_2$H$_6$) or monosilane (SiH$_4$) is used as the process gas of the silicon film 4.

In the case where the silicon film is formed on the seed layer 3 by deposition (vapor phase growth) or adsorption through the use of the high-order silane-based gas not containing an amino group, the silicon film can be used as one of the multiple seed layers, i.e., the second seed layer 3a in this example. This is because, even if the film thickness of the silicon film thus formed is small, it is possible to suppress generation of a pinhole.

According to the second embodiment described above, the second seed layer 3a which is small in film thickness, free from a pinhole and superior in flatness can be formed on the seed layer 3 through deposition or adsorption. This makes it possible to obtain an advantage in that the silicon film 4 superior in flatness can be similarly formed on the second seed layer 3a by deposition.

Application Example 2: One Example of Multiple Seed Layers+Hole or Groove Filling Application example 2 is associated with a sequence in which a silicon film is formed on the multiple seed layers described in application example 1 and a hole or groove is filled with the silicon film.

FIGS. 16A to 16F are sectional views schematically showing states of a workpiece in one example of sequences on application example 2 of a silicon film forming method according to a second embodiment of the present disclosure.

Figure 16A:
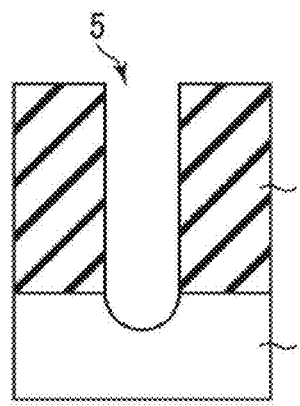
FIGS. 16A to 16F are sectional views schematically showing states of a workpiece in one example of sequences on application example 2 of a silicon film forming method according to a second embodiment of the present disclosure.

First, as shown in FIG. 16A, a silicon oxide film 2 is formed on a silicon substrate 1. Extending from the surface of the silicon oxide film 2 to the silicon substrate 1, a hole or groove is formed at the silicon oxide film 2. In this example, a seed layer 3 is formed on a workpiece having the above-mentioned structure.

Figure 16B:
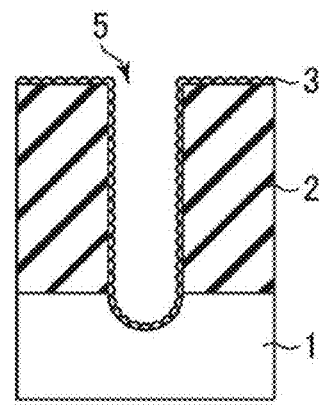

Then, as shown in FIG. 16B, according to the methods described in the first and second embodiments, a seed layer 3 is formed on the surface (processed surface) of the silicon oxide film 2 having the hole or groove 5.

Figure 16C:
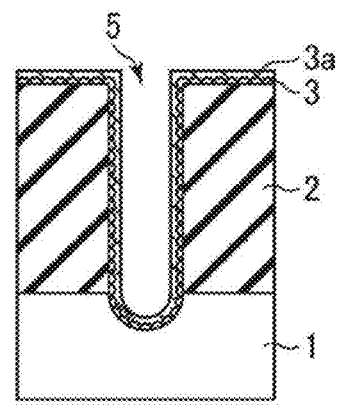

Subsequently, as shown in FIG. 16C, a second seed layer 3a is formed on the seed layer 3 according to the method described in the second embodiment. Thus, multiple seed layers are formed. It is preferred in some embodiments that the seed layer 3 and the second seed layer 3a are formed in a non-doping manner. This is to maintain flatness of the surface of the multiple seed layers including the seed layer 3 and the second seed layer 3a. In other words, if the seed layer 3 and the second seed layer 3a are formed while doping an impurity serving as a donor or an acceptor, e.g., arsenic, phosphorus or boron, there is a possibility that the flatness of the surface of the multiple seed layers will be damaged. This possibility can be solved by forming the seed layer 3 and the second seed layer 3a in a non-doping manner.

Figure 17:
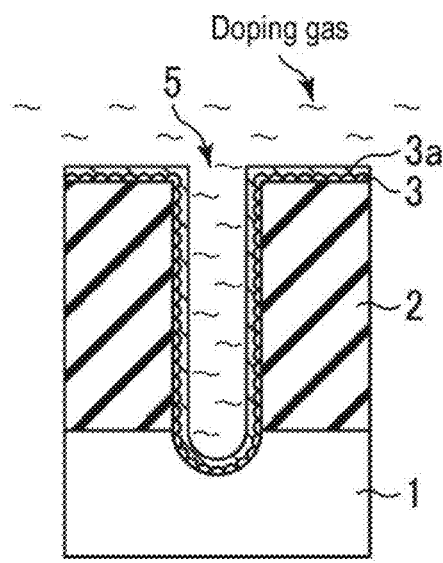
FIG. 17 is a sectional view showing a state in which an impurity is diffused into a seed layer and a second seed layer.

In the case where the seed layer 3 and the second seed layer 3a are formed in a non-doping manner, as shown in FIG. 17, an impurity serving as a donor or an acceptor may be doped by, e.g., a vapor phase diffusion method, after forming the seed layer 3 and the second seed layer 3a. If an impurity serving as a donor or an acceptor, e.g., arsenic, phosphorus or boron, is doped by a vapor phase diffusion method after forming the seed layer 3 and the second seed layer 3a in a non-doping manner, it is possible to reduce a resistance value of the multiple seed layers while maintaining good flatness of the surface of the multiple seed layers.

Figure 16D:
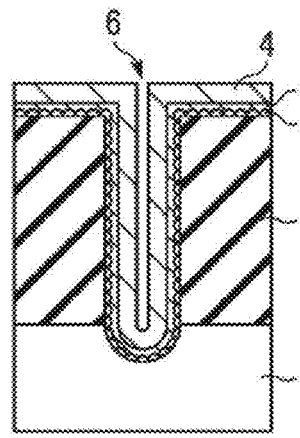

Next, as shown in FIG. 16D, a silicon film 4 is formed by supplying a silane-based gas not containing an amino group onto the multiple seed layers, including the seed layer 3 and the second seed layer 3a. Then, silicon is deposited on the multiple seed layers. At this time, the silicon film 4 is formed with a film thickness which is not to close the hole or groove 5 while leaving an opening portion 6 corresponding to the hole or groove 5. As the silane-based gas not containing an amino group is used, it may be possible to select either a monosilane gas or a high-order silane-based gas which has an order equal to or higher than disilane. In view of completeness of step coverage, it is advisable to select the monosilane gas. This is because, as compared with the silicon film formed by using, e.g., a disilane gas as the source gas, the silicon film formed by using the monosilane gas as the source gas helps increase the step coverage when covering the hole or groove 5.

Figure 16E:
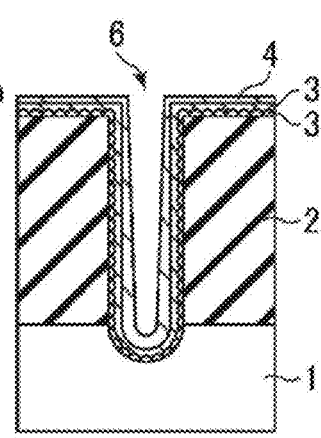

Subsequently, as shown in FIG. 16E, the silicon film 4 is etched and this etching left the silicon film 4 along the hole or groove 5, thereby enlarging the opening portion 6 of the silicon film 4 corresponding to the hole or groove 5. In this example, the silicon film 4 is etched such that the cross section thereof has a V-like shape. In the present specification, this is called V-like etching.

Figure 18:
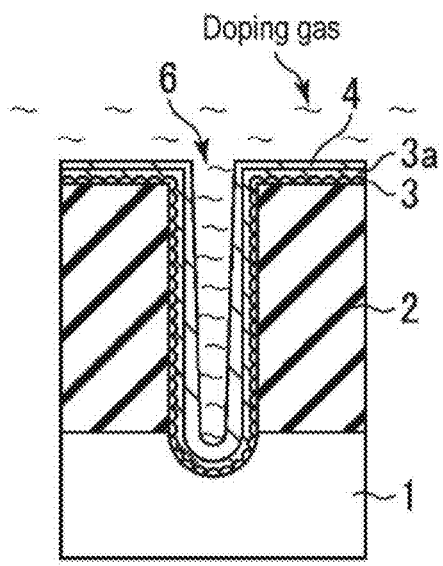
FIG. 18 is a sectional view showing a state in which an impurity is diffused into an etched silicon film.

It is preferred in some embodiments that the silicon film 4 is formed in a non-doping manner, just like the seed layer 3 and the second seed layer 3a. This is to maintain the flatness of the surface of the silicon film 4. In the case where the silicon film 4 is formed in a non-doping manner, an impurity serving as a donor or an acceptor may be doped by, e.g., a vapor phase diffusion method as shown in FIG. 18, after etching the silicon film 4 as shown in FIG. 16E. If an impurity serving as a donor or an acceptor, e.g., arsenic, phosphorus or boron, is doped by a vapor phase diffusion method after the silicon film 4 is formed in a non-doping manner and then etched, it is possible to reduce a resistance value of the silicon film 4.

Figure 16F:
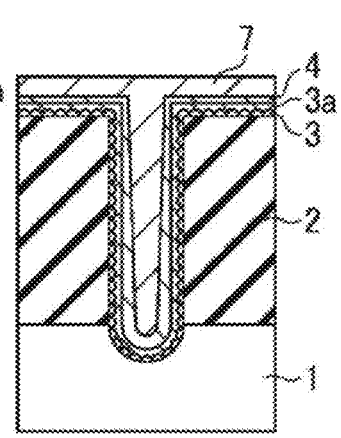

Then, as shown in FIG. 16F, a thin film 7 for filling the opening portion 6 is formed on the silicon film 4 of which opening portion 6 is enlarged. The thin film 7 may be a silicon film or may be a thin film other than the silicon film, e.g., a metal film.

As described above, the second embodiment can be applied to filling sequences for filling the hole or groove formed on the processed surface, namely the hole or groove 5 formed at the silicon oxide film 2 in this example.

<V-Like Etching. Aspect Ratio Dependency>

It was confirmed that the in-hole or in-groove cross-sectional shape of the silicon film 4 subjected to the V-like etching shown in FIG. 16E is associated with the aspect ratio of the opening portion 6, which corresponds to the hole or groove 5, of the silicon film 4 subjected to the deposition process shown in FIG. 16D.

Figure 19A:
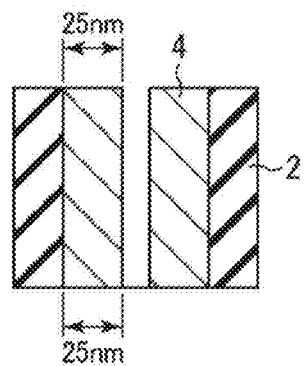
FIGS. 19A to 19C are sectional views for explaining a definition of "etching coverage".
Figure 19B:
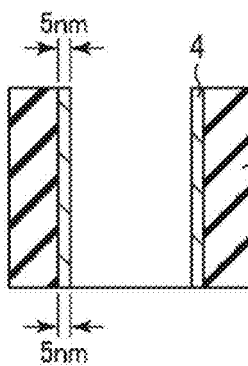
Figure 19C:
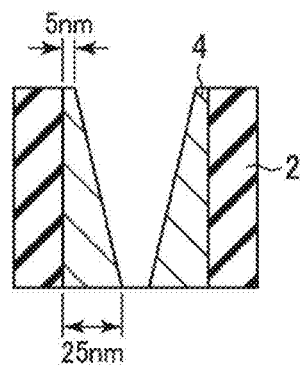

A term "etching coverage" will be defined in order to explain the above relationship. FIGS. 19A to 19C are sectional views for explaining a definition of an "etching coverage".

FIG. 19A is a sectional view of an initial state. It is assumed that, e.g., in the initial state a silicon film 4 is formed to have a top film thickness of 25 nm and a bottom film thickness of 25 nm. It is also assumed that, as shown in FIG. 19B, the silicon film 4 is etched into a conformal shape so as to have a top film thickness of 5 nm and a bottom film thickness of 5 nm, respectively. In this state, the etching coverage is equal to 0%. It is further assumed that the silicon film 4 is etched so as to have a top film thickness of 5 nm with a bottom film thickness of 25 nm unchanged. In this state, the etching coverage is equal to 100%.

Figure 20A:
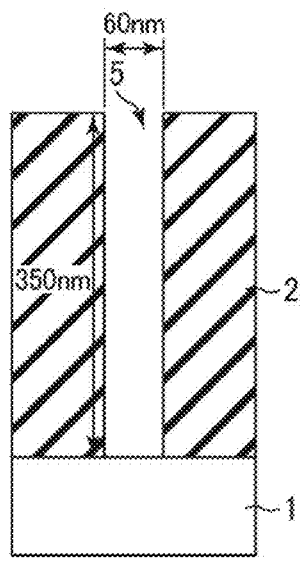
FIG. 20A is a sectional view showing an initial state of a hole or groove.
Figure 20B:
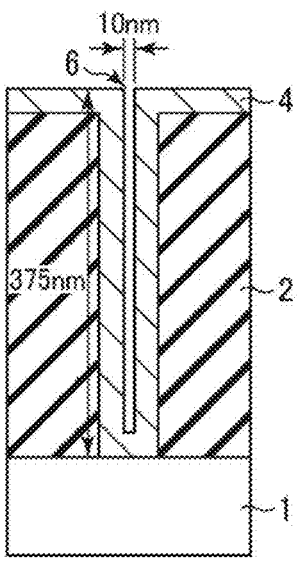
FIG. 20B is a sectional view showing a case where an aspect ratio of an opening portion is "37.5".
Figure 20C:
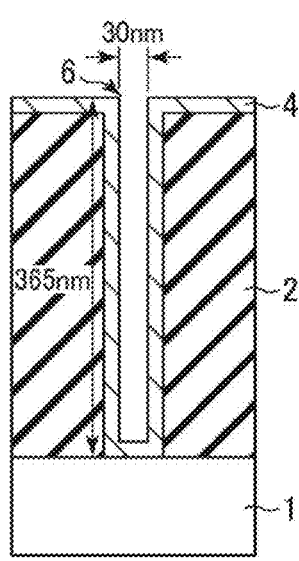
FIG. 20C is a sectional view showing a case where an aspect ratio of an opening portion is "12".

FIG. 20A is a sectional view showing the initial state of the hole or groove 5. FIG. 20B is a sectional view showing a case where the aspect ratio of the opening portion 6 of the silicon film 4 corresponding to the hole or groove 5 is "37.5". FIG. 20C is a sectional view showing a case where the aspect ratio of the opening portion 6 is "12". FIG. 21 is a view showing a relationship between the aspect ratio and the etching coverage.

As shown in FIG. 21, when the aspect ratio of the opening portion 6 is "12", the etching coverage comes to about 27%. In contrast, when the aspect ratio is "37.5", the etching coverage comes to about 89%. If these points are interconnected by a straight line, the etching coverage comes closer to about 0%, when the aspect ratio is zero (namely, a planar surface).

As described above, the aspect ratio of the opening portion 6, which corresponds to the hole or groove 5, of the silicon film 4 subjected to the deposition process shown in FIG. 16D is associated with the in-hole or in-groove cross-sectional shape of the silicon film 4 subjected to the V-like etching shown in FIG. 16E.

That is to say, if one wishes to control the in-hole or in-groove cross-sectional shape of the silicon film 4 subjected to the V-like etching so as to become narrower toward the bottom of the hole or groove 5 (namely, if one wishes to have the etching coverage come closer to 100%), the aspect ratio of the opening portion 6 is made larger. The reason is that, if the aspect ratio of the opening portion 6 is increased, an etching gas hardly can enter the inside of the opening portion 6 and the cross-sectional shape of the silicon film 4 comes closer to 100% etching coverage.

As described above, if the aspect ratio of the opening portion 6 after forming the silicon film 4 is controlled, it becomes possible to control the in-hole or in-groove cross-sectional shape of the silicon film 4 subjected to the V-like etching. As a result of the cross-sectional shape being controlled in this way, the etching coverage after the V-like etching comes closer to 100%. This makes it possible to obtain an advantage in that the opening portion 6 which can be easily filled with the thin film 7 is acquired.

Application Example 3: Another Example of Multiple Seed Layers+Hole or Groove Filling Application example 3 is associated with another sequence in which a silicon film is formed on the multiple seed layers described in application example 1 and a hole or groove is filled with the silicon film.

FIGS. 22A to 22I are sectional views schematically showing states of a workpiece in one example of sequences on application example 3 of a silicon film forming method according to a second embodiment of the present disclosure.

Figure 22A:
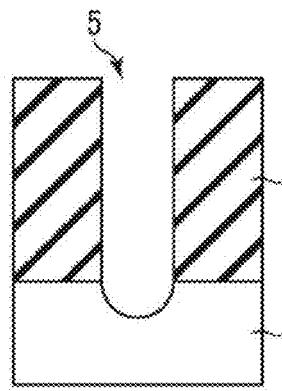
FIGS. 22A to 22I are sectional views schematically showing states of a workpiece in one example of sequences on application example 3 of a silicon film forming method according to a second embodiment of the present disclosure.
Figure 22B:
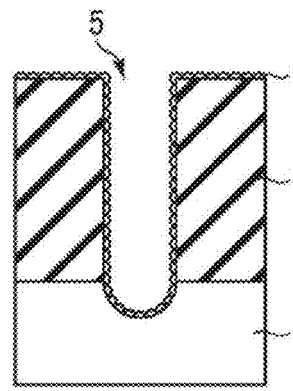
Figure 22C:
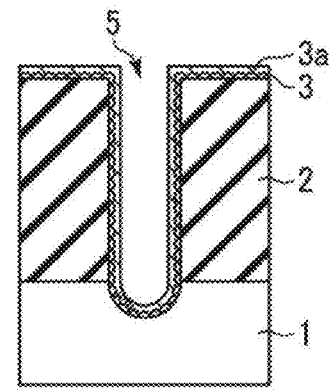
Figure 23:
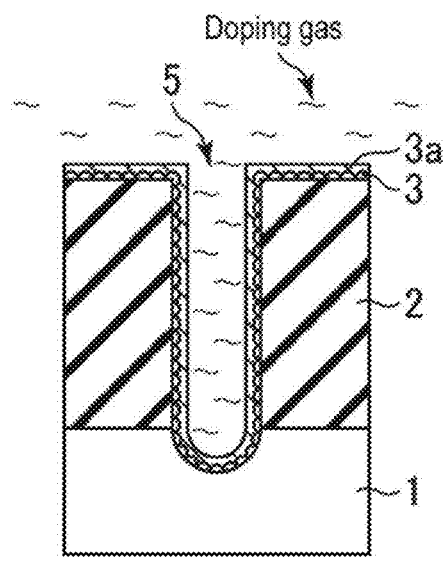
FIG. 23 is a sectional view showing a state in which an impurity is diffused into a seed layer and a second seed layer.

First, as shown in FIGS. 22A to 22C, a second seed layer 3a is formed according to the method of application example 2 described with reference to FIGS. 16A to 16C. In this example, it is preferred that the seed layer 3 and the second seed layer 3a are formed in a non-doping manner. In this case, as shown in FIG. 23, an impurity serving as a donor or an acceptor may be doped on the seed layer 3 and the second seed layer 3a by, e.g., a vapor phase diffusion method.

Figure 22D:
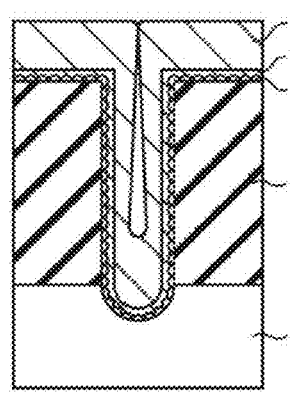

Then, as shown in FIG. 22D, a silicon film 4 is formed by supplying a silane-based gas not containing an amino group onto the multiple seed layers including the seed layer 3 and the second seed layer 3a and then depositing silicon on the multiple seed layers. In this example, the step coverage of the silicon film 4 does not matter. The hole or groove 5 may be closed during the process.

Figure 22E:
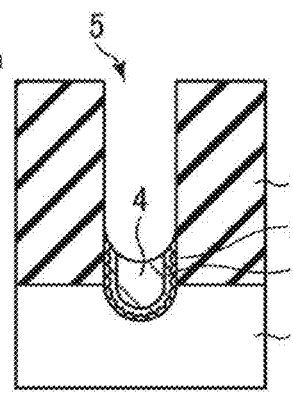

Subsequently, as shown in FIG. 22E, the silicon film 4, the seed layer 3 and the second seed layer 3a are etched while leaving the silicon film 4 on the bottom of the hole or groove 5.

Figure 24:
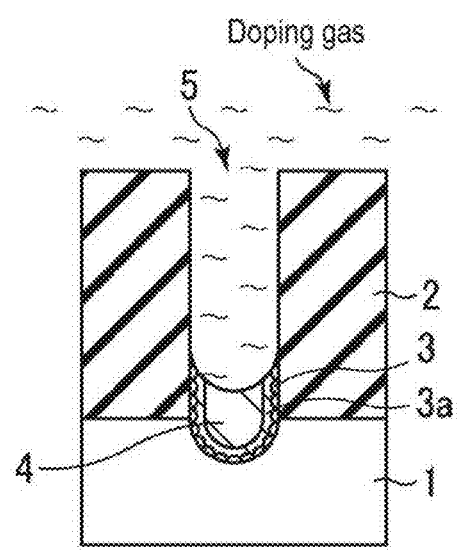
FIG. 24 is a sectional view showing a state in which an impurity is diffused into an etched silicon film.

In this example, the silicon film 4 is formed in a non-doping manner. In this case, as shown in FIG. 24, an impurity serving as a donor or an acceptor may be doped on the etched silicon film 4 by, e.g., a vapor phase diffusion method.

Figure 22F:
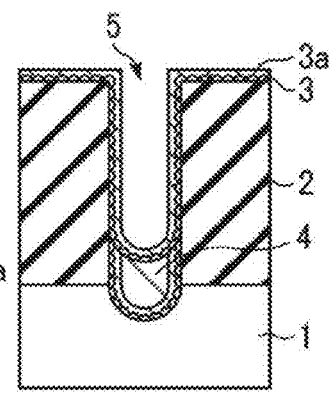

Then, as shown in FIG. 22F, the seed layer 3 and the second seed layer 3a are formed again by repeating the steps shown in FIGS. 22B and 22C.

Figure 22G:
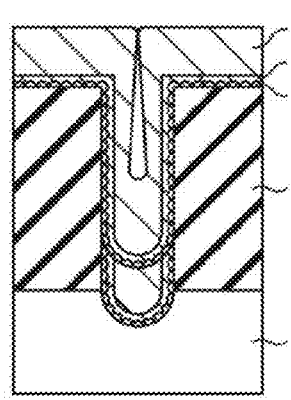
Figure 22H:
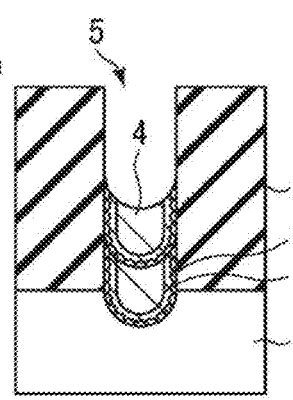

Subsequently, as shown in FIG. 22G, the silicon film 4 is formed again by repeating the step shown in FIG. 22D. Thereafter, as shown in FIG. 22H, the step shown in FIG. 22E is repeated to etch the silicon film 4, the seed layer 3 and the second seed layer 3a while leaving the silicon film 4 on the bottom of the hole or groove 5.

Figure 22I:
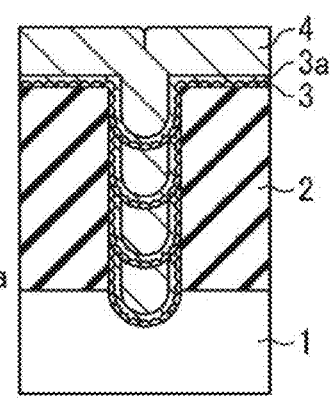

Thereafter, the steps shown in FIGS. 22B to 22E are repeated for a designed number of times, and thereby the hole or groove 5 is filled with the silicon film 4 as shown in FIG. 22I.

As described above, the second embodiment can be applied to filling sequences in which the hole or groove formed on the processed surface, namely the hole or groove 5 formed at the silicon oxide film 2 in this example, is filled by repeating forming the multiple seed layers, depositing the silicon film 4 and then etching.

In the example shown in FIGS. 22A to 22I, three steps, namely the formation of the multiple seed layers including the seed layer 3 and the second seed layer 3a, the formation of the silicon film 4 and the etching of the silicon film 4 and the multiple seed layers, were repeated for a designed number of times.

Alternatively, as shown in FIGS. 25A to 25D, "the formation of the multiple seed layers including the seed layer 3 and the second seed layer 3a" may be performed with respect to only the first layer. With respect to the second and subsequent layers, two steps, namely the formation of the silicon film 4 and the two processes of etching the silicon film 4, may be repeated for a designated number of times.

Figure 26A:
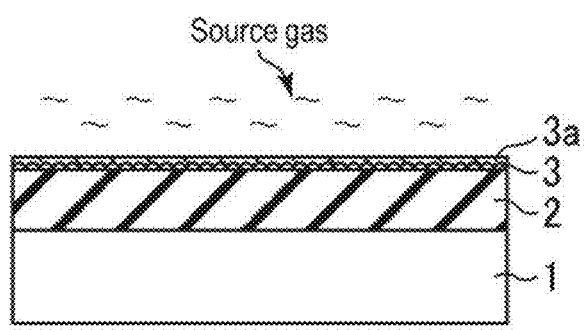
FIGS. 26A and 26B are sectional views showing a doping example with respect to a second seed layer.
Figure 26B:
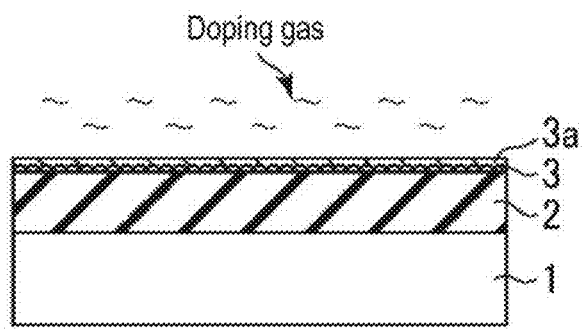
Figure 27A:
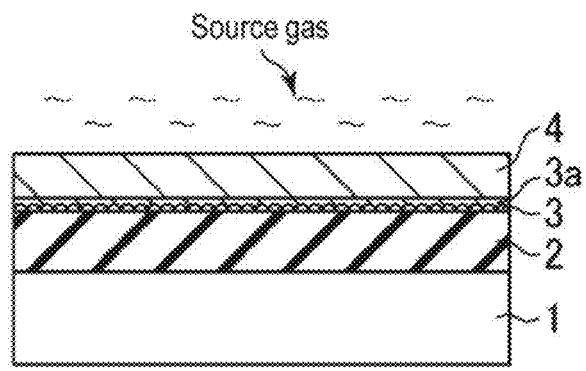
FIGS. 27A and 27B are sectional views showing a doping example with respect to a silicon film.
Figure 27B:
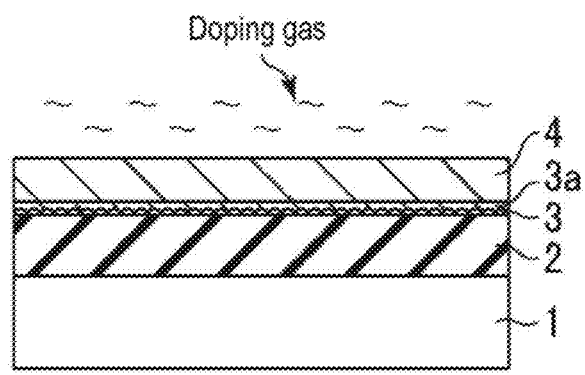

Application Example 4: An Example of Doping for the Second Seed Layer and the Silicon Film In the second embodiment, when the second seed layer 3a and the silicon film 4 are doped with an impurity serving as a donor or an acceptor, a non-doped second seed layer 3a and a non-doped silicon film 4 are formed using a source gas (a process gas) as shown in FIGS. 26A and 27A. Thereafter, as shown in FIGS. 26B and 27B, a doping gas containing an impurity serving as a donor or an acceptor, e.g., arsenic, phosphorus or boron, is supplied to the non-doped second seed layer 3a and the non-doped silicon film 4. Thus, the impurity is doped to the non-doped second seed layer 3a and the non-doped silicon film 4 by a vapor phase diffusion method. The reason for doing so is that a resistance value can be reduced while maintaining good flatness on the surfaces of the second seed layer 3a (the multiple seed layers) and the silicon film 4, respectively.

Figure 28:
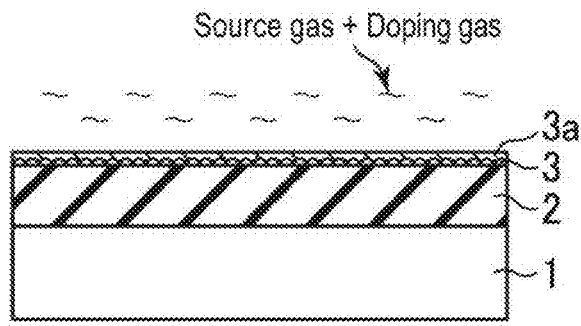
FIG. 28 is a sectional view showing another doping example with respect to a second seed layer.
Figure 29:
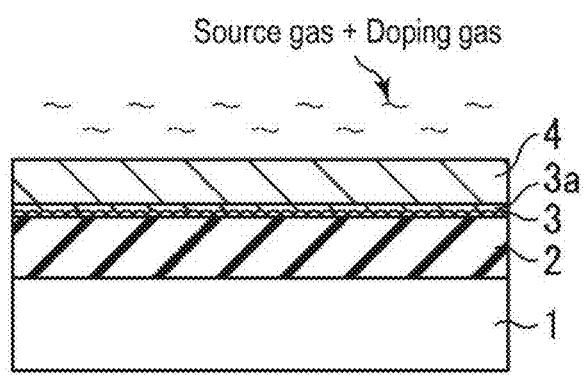
FIG. 29 is a sectional view showing another doping example with respect to a silicon film.

However, it is sometimes the case that a certain degree of surface roughness is permitted with respect to the process. In this case, as shown in FIGS. 28 and 29, the second seed layer 3a and the silicon film 4 doped with the impurity can be formed by supplying the source gas (process gas) and the doping gas simultaneously. During the formation of the seed layer 3, the source gas (process gas) and the doping gas may be or may not be simultaneously supplied. That is to say, in the step of forming the multiple seed layers including the seed layer 3 and the second seed layer 3a, it is only necessary that the source gas (process gas) and the doping gas should be simultaneously supplied at least during formation of the second seed layer 3a.

Figure 30A:
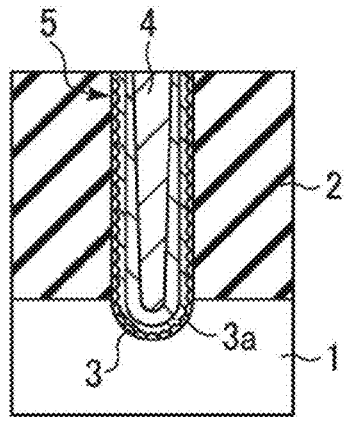
FIGS. 30A to 30C are sectional views showing final shapes of a silicon film.
Figure 30B:
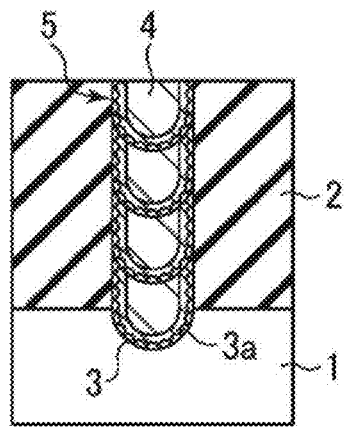
Figure 30C:
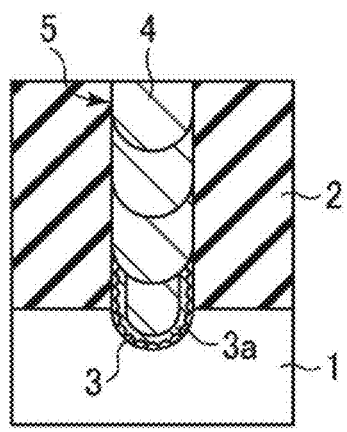

The doping examples shown in FIGS. 28 and 29 are effective in, e.g., the process of filling the hole or groove 5 with the silicon film 4, which is described with reference to FIGS. 16A to 16F, FIGS. 22A to 22I and FIGS. 25A to 25D. This is because, in this process, there may be a case where the surface formed during deposition is moved back in the final phase through, e.g., etching or grinding. For that reason, there may be a case where strict accuracy of surface roughness is not required. One example of the final shape of the silicon film 4 obtained in the process shown in FIGS. 16A to 16F is illustrated in FIG. 30A. One example of the final shape of the silicon film 4 obtained in the process shown in FIGS. 22A to 22I is illustrated in FIG. 30B. One example of the final shape of the silicon film 4 obtained in the process shown in FIGS. 25A to 25D is illustrated in FIG. 30C.

Third Embodiment

Next, one example of a film forming apparatus capable of implementing the silicon film forming methods according to the first and second embodiments of the present disclosure will now be described as a third embodiment.

<Film Forming Apparatus>

Figure 31:
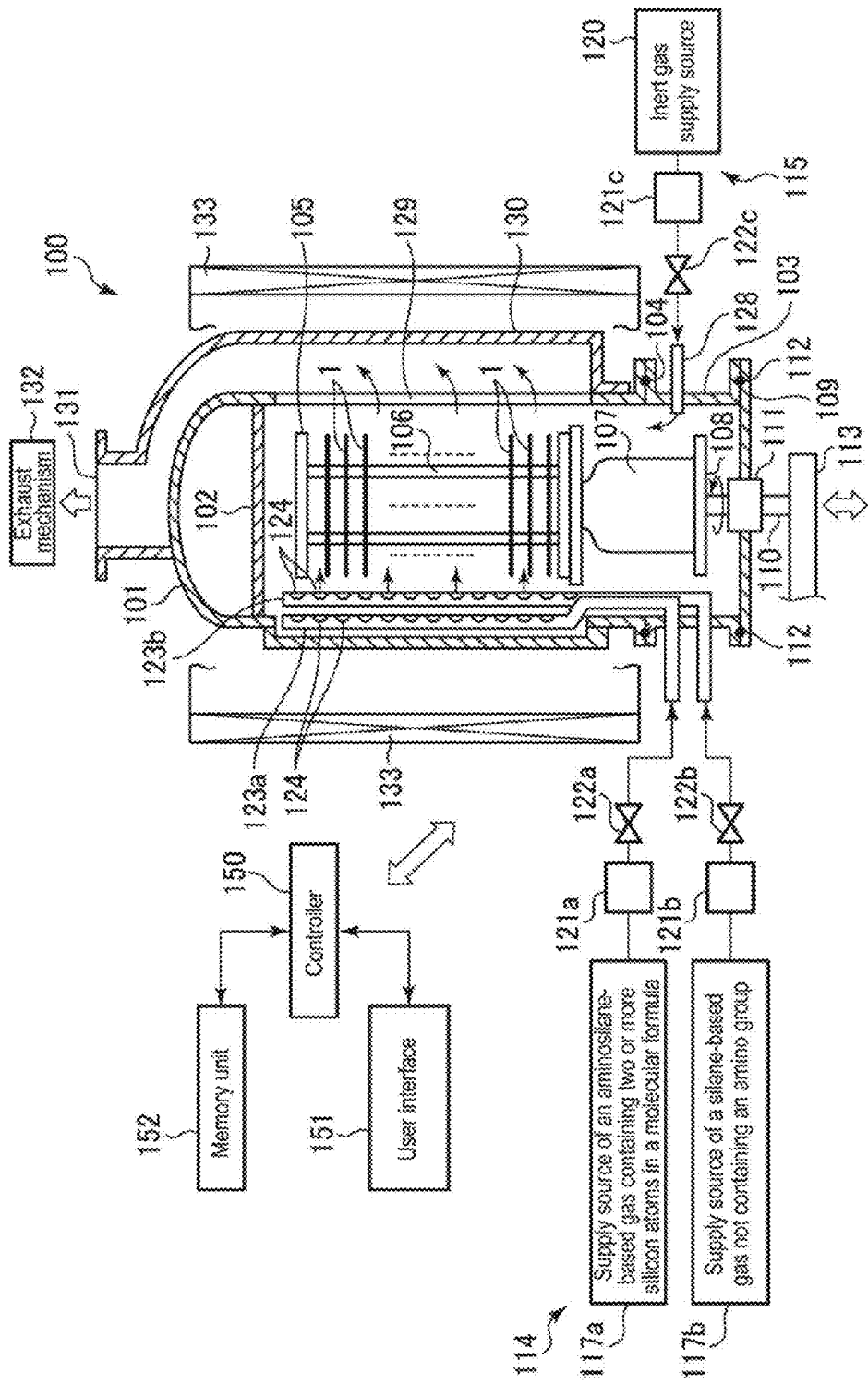
FIG. 31 is a sectional view schematically showing one example of a film forming apparatus according to a third embodiment of the present disclosure.

FIG. 31 is a sectional view schematically showing one example of a film forming apparatus according to a third embodiment of the present disclosure.

As shown in FIG. 31, a film forming apparatus 100 includes a cylindrical processing chamber 101 having a lower end opening portion and a roof. The processing chamber 101 as a whole is made of, e.g., quartz. A quartz-made ceiling plate 102 is installed at the roof of the processing chamber 101. A manifold 103 formed into a cylindrical shape by, e.g., stainless steel, is connected to the lower end opening portion of the processing chamber 101 through a seal member 104 such as an O-ring or the like.

The manifold 103 supports a lower end portion of the processing chamber 101. A quartz-made wafer boat 105 capable of holding a plurality of, e.g., 50 to 100, semiconductor substrates as workpieces (silicon substrates 1 in this example), in multiple stages can be inserted into the processing chamber 101 at the lower side of the manifold 103. Thus, the silicon substrates 1 are accommodated within the processing chamber 101. The wafer boat 105 includes a plurality of posts 106. The silicon substrates 1 are supported by grooves formed in the posts 106.

The wafer boat 105 is mounted on a table 108 through a quartz-made heat insulating mould 107. The table 108 is supported on a rotation shaft 110 that extends through a cover portion 109 which is made of, e.g., stainless steel and configured to open and close a lower end opening portion of the manifold 103. For example, a magnetic fluid seal 111 is installed at the portion of the rotation shaft 110 extending through the cover portion 109. The magnetic fluid seal 111 tightly seals and rotatably supports the rotation shaft 110. A seal member 112 formed of, e.g., an O-ring, is interposed between a peripheral portion of the cover portion 109 and a lower end portion of the manifold 103. Thus, the interior of the processing chamber 101 is kept sealed. The rotation shaft 110 is installed at the frontal end of an arm 113 supported by an elevating mechanism (not shown) such as, e.g., a boat elevator or the like. Thus, the wafer boat 105, the cover portion 109 and so forth are moved up and down as a unit, whereby the wafer boat 105 is inserted into and removed from the processing chamber 101.

The film forming apparatus 100 includes a process gas supply mechanism 114 configured to supply a process gas into the processing chamber 101 and an inert gas supply mechanism 115 configured to supply an inert gas into the processing chamber 101.

In this example, the process gas supply mechanism 114 includes a supply source 117a of an aminosilane-based gas containing two or more silicon atoms in a molecular formula (hereinafter abbreviated as "aminosilane-based gas supply source 117a") and a supply source 117b of a silane-based gas not containing an amino group (hereinafter abbreviated as "silane-based gas supply source 117b"). The inert gas supply mechanism 115 includes an inert gas supply source 120. One example of the aminosilane-based gas containing two or more silicon atoms in a molecular formula is DIPADS. One example of the silane-based gas not containing an amino group is $Si_2H_6$. One example of the inert gas is a nitrogen gas. The inert gas is used as a purge gas or the like.

The aminosilane-based gas supply source 117a is connected to a dispersion nozzle 123a through a flow rate controller 121a and an opening/closing valve 122a. Similarly, the silane-based gas supply source 117b is connected to a dispersion nozzle 123b through a flow rate controller 121b and an opening/closing valve 122b.

Figure 32:
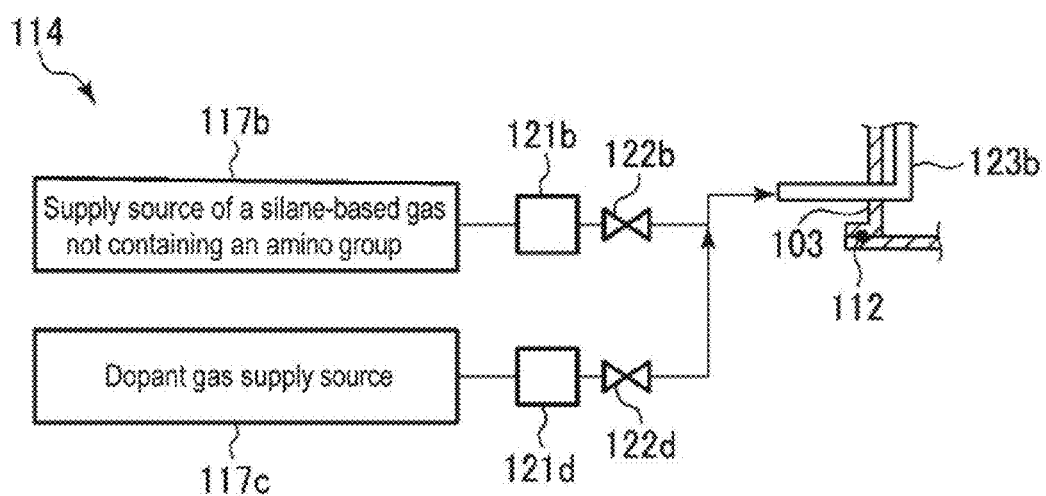
FIG. 32 is a view showing a modified example of a process gas supply mechanism.

When a dopant gas is supplied with the silane-based gas not containing an amino group, a dopant gas supply source 117c is further installed at the process gas supply mechanism 114 as shown in FIG. 32. The dopant gas supply source 117c is connected to the dispersion nozzle 123b through a flow rate controller 121d and an opening/closing valve 122d.

The dispersion nozzles 123a and 123b are formed by quartz pipes. The dispersion nozzles 123a and 123b extend inward through a sidewall of the manifold 103. Then, the dispersion nozzles 123a and 123b are bent upward and extended in a vertical direction. Gas discharge holes 124 are formed with a specified interval at the vertically extending portion of each of the dispersion nozzles 123a and 123b. Thus, the respective gases are substantially uniformly discharged from the gas discharge holes 124 toward the interior of the processing chamber 101 in a horizontal direction.

The inert gas supply source 120 is connected to a nozzle 128 through a flow rate controller 121c and an opening/closing valve 122c. The nozzle 128 extends through a sidewall of the manifold 103. The nozzle 128 is configured to discharge an inert gas from the frontal end thereof toward the interior of the processing chamber 101 in the horizontal direction.

An exhaust port 129 configured to evacuate the interior of the processing chamber 101 is installed at the opposite side of the processing chamber 101 from the dispersion nozzles 123a and 123b. The exhaust port 129 is formed into an elongated shape by cutting the sidewall of the processing chamber 101 along an up and down direction. An exhaust port cover member 130 having an inverse C-like shaped cross-section is welded to the portion of the processing chamber 101 corresponding to the exhaust port 129 so as to cover the exhaust port 129. The exhaust port cover member 130 extends upward along the sidewall of the processing chamber 101 and defines a gas outlet 131 at the upper side of the processing chamber 101. An exhaust mechanism 132 including a vacuum pump or the like is connected to the gas outlet 131. The exhaust mechanism 132 evacuates the interior of the processing chamber 101, thereby exhausting the process gas used in the process and setting an internal pressure of the processing chamber 101 to a process pressure according to the process.

A tubular heating device 133 is installed on an outer circumference of the processing chamber 101. The heating device 133 activates the gas supplied into the processing chamber 101 and heats the workpieces accommodated within the processing chamber 101, namely the silicon substrates 1 in this example.

The respective components of the film forming apparatus 100 are controlled by a controller 150 formed by, e.g., a microprocessor (computer). Connected to the controller 150 is a user interface 151 that includes a touchpad through which an operator performs an input operation of commands to manage the film forming apparatus 100 and a display which visually displays an operating situation of the film forming apparatus 100.

A memory unit 152 is connected to the controller 150. The memory unit 152 stores a control program configured to execute various processes in the film forming apparatus 100 under control of the controller 150, and a program (i.e., a recipe) configured to execute a process in the respective components of the film forming apparatus 100 according to the process conditions. For example, the recipe is stored in a memory medium of the memory unit 152. The memory medium may be a hard disk or a semiconductor memory, or may be a portable one such as a CD-ROM, a DVD or a flash memory. The recipe may be suitably transmitted from other device through a dedicated line. If necessary, the recipe is read from the memory unit 152 in response to a command received from the user interface 151, and the controller 150 executes a process according to the recipe thus read. Thus, the film forming apparatus 100 performs a desired process under the control of the controller 150.

In this example, under the control of the controller 150, the film forming processes of the silicon film forming method according to the first embodiment or the film forming processes of the silicon film forming method according to the second embodiment are sequentially implemented.

The silicon film forming methods according to the first and second embodiments may be performed using a single film forming apparatus such as the film forming apparatus 100 shown in FIG. 31.

The film forming apparatus is not limited to the batch type shown in FIG. 31 but may be a single-wafer type film forming apparatus.

While some embodiments have been described above, the present disclosure is not limited thereto but may be modified in many different ways.

While the silicon substrates 1 are used as the workpieces in the aforementioned embodiments, the workpieces are not limited to the silicon substrates 1. The embodiments may be properly applied not only to a method of manufacturing electronic products that are being miniaturized, e.g., a semiconductor device manufacturing process, but also to a process for manufacturing a flat panel display. In addition, the present disclosure can be differently modified without departing from the spirit thereof.

According to the present disclosure, it is possible to provide a silicon film forming method capable of coping with a demand for further reduction in film thickness and capable of improving the accuracy of surface roughness.

According to the present disclosure, it is possible to provide a thin film forming method for, through the use of the silicon film forming method, forming a thin film on a workpiece having a processed surface and a hole or a groove defined on the processed surface.

According to the present disclosure, it is possible to provide a silicon film forming method for, through the use of the silicon film forming method, forming a silicon film on a workpiece having a processed surface and a hole or a groove defined on the processed surface.

According to the present disclosure, it is possible to provide a cross-sectional shape control method capable of controlling an in-hole or in-groove cross-sectional shape of a thin film formed along a hole or a groove.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A silicon film forming method for forming a silicon film on a workpiece having a processed surface, comprising:

forming a first seed layer by supplying a high-order aminosilane-based gas containing two or more silicon atoms in a molecular formula onto the processed surface and by having silicon adsorbed onto the processed surface;

forming a second seed layer by supplying a high-order silane-based gas containing two or more silicon atoms in a molecular formula and not containing an amino group onto the first seed layer and by depositing silicon onto the first seed layer; and after the second seed layer is formed, forming a silicon film by supplying a silane-based gas not containing an amino group onto the second seed layer and by depositing silicon on the second seed layer, wherein, when forming a first seed layer, a process temperature is set within a range of less than 300 degrees C. and more than 200 degrees C., wherein the silane-based gas not containing an amino group, which is used when forming a silicon film, is a silane-based gas having an order equal to or lower than the high-order silane-based gas not containing an amino group, which is used when forming a second seed layer, and wherein a thickness of the second seed layer ranges from 2 nm to 4 nm.

2. The method of claim 1, wherein the first seed layer is formed by having silicon adsorbed onto the processed surface, and an adsorption density of the silicon is controlled by adjusting the process temperature of forming a first seed layer is set within the range of less than 300 degrees C. and more than 200 degrees C.

3. The method of claim 1, wherein the process temperature of forming a first seed layer is set within a range of less than 250±25 degrees C.

4. The method of claim 1, wherein the high-order aminosilane-based gas containing two or more silicon atoms in a molecular formula is selected from gases containing at least one kind of silicon amino compound represented by a formula:

$$((R1R2)N)_n Si_X H_{2X+2-n-m}(R3)_m \quad (A); \text{ and}$$

$$((R1R2)N)_n Si_X H_{2X-n-m}(R3)_m \quad (B),$$

where n is the number of amino groups, which is a natural number of 1 to 6, m is the number of alkyl groups, which is zero or a natural number of 1 to 5, R1, R2, and R3 are $CH_3$, $C_2H_5$ and $C_3H_7$, R1, R2 and R3 may be identical with each other or may not be identical with each other, R3 may be Cl, and X is a natural number equal to or greater than two.

5. The method of claim 4, wherein the high-order aminosilane-based gas represented by the formula (A) is selected from a group consisting essentially of:
  diisopropylaminodisilane ($Si_2H_5N(iPr)_2$);
  diisopropylaminotrisilane ($Si_3H_7N(iPr)_2$);
  diisopropylaminochlorodisilane ($Si_2H_4ClN(iPr)_2$); and
  diisopropylaminochlorotrisilane ($Si_3H_6ClN(iPr)_2$).

6. The method of claim 4, wherein the high-order aminosilane-based gas represented by the formula (B) is selected from a group consisting essentially of:
  diisopropylaminocyclotrisilane ($Si_3H_5N(iPr)_2$); and
  diisopropylaminochlorocyclotrisilane ($Si_3H_4ClN(iPr)_2$).

7. The method of claim 1, wherein the high-order silane-based gas containing two or more silicon atoms in a molecular formula and not containing an amino group include a gas containing at least one selected from a group consisting essentially of:
  $Si_2H_6$;
  silicon hydride which is represented by formula $Si_mH_{2m+2}$ (where m is a natural number equal to or greater than 3); and
  silicon hydride which is represented by formula $Si_nH_{2n}$ (where n is a natural number equal to or greater than 3).

8. The method of claim 7, wherein the silicon hydride represented by the formula $Si_mH_{2m+2}$ includes at least one selected from a group consisting essentially of:
  $Si_3H_8$;
  $Si_4H_{10}$;
  $Si_5H_{12}$;
  $Si_6H_{14}$; and
  $Si_7H_{16}$, and
the silicon hydride represented by the formula $Si_nH_{2n}$ includes at least one selected from a group consisting essentially of:
  $Si_3H_6$;
  $Si_4H_8$;
  $Si_5H_{10}$;
  $Si_6H_{12}$; and
  $Si_7H_{14}$.

9. The method of claim 1, wherein the second seed layer is formed by vapor phase growth of silicon on the first seed layer.

10. The method of claim 1, wherein the silane-based gas having an order equal to or lower than the high-order silane-based gas is $SiH_4$ or $Si_2H_6$.

11. A thin film forming method for forming a thin film on a workpiece having a processed surface and a hole or groove defined on the processed surface, comprising:
  forming multiple seed layers including a first seed layer and a second seed layer on the processed surface according to the silicon film forming method of claim 1;
  forming a silicon film at such a film thickness as not to close the hole or groove while leaving an opening portion corresponding to the hole or groove, by supplying a silane-based gas not containing an amino group onto the multiple seed layers and by depositing silicon on the multiple seed layers;
  enlarging the opening portion of the silicon film corresponding to the hole or groove by partially etching the silicon film while leaving the silicon film along the hole or groove; and
  forming an opening-portion-filling thin film on the silicon film whose opening portion is enlarged.

12. The method of claim 11, wherein the silane-based gas not containing an amino group, which is used when forming a silicon film at such a film thickness as not to close the hole or groove while leaving an opening portion corresponding to the hole or groove, is a silane-based gas having an order equal to or lower than the high-order silane-based gas containing two or more silicon atoms in a molecular formula and not containing an amino group, which is used when forming multiple seed layers.

13. The method of claim 12, wherein the silane-based gas having an order equal to or lower than the high-order silane-based gas is $SiH_4$ or $Si_2H_6$.

14. The method of claim 11, wherein, when forming multiple seed layers, a source gas and a doping gas containing an impurity serving as a donor or an acceptor are simultaneously supplied at least during formation of the second seed layer.

15. The method of claim 11, further comprising:
  after forming multiple seed layers, doping an impurity serving as a donor or an acceptor on the multiple seed layers.

16. The method of claim 11, wherein, when forming a silicon film at such a film thickness as not to close the hole or groove while leaving an opening portion corresponding to the hole or groove, the silane-based gas not containing an amino group and a doping gas containing an impurity serving as a donor or an acceptor are simultaneously supplied.

17. The method of claim 11, further comprising:
  after enlarging the opening portion of the silicon film corresponding to the hole or groove, doping an impurity serving as a donor or an acceptor on the silicon film whose opening portion is enlarged.

18. The method of claim 15, wherein the impurity is doped by a vapor phase diffusion method.

19. The method of claim 11, wherein, when controlling an in-hole or in-groove cross-sectional shape of the silicon film subjected to enlarging the opening portion of the silicon film corresponding to the hole or groove, the in-hole or in-groove cross-sectional shape of the silicon film is controlled by changing an aspect ratio of the opening portion, which corresponds to the hole or groove, of the silicon film subjected to forming a silicon film at such a film thickness as not to close the hole or groove while leaving an opening portion corresponding to the hole or groove.

20. The method of claim 17, wherein, when controlling an in-hole or in-groove cross-sectional shape of the silicon film so as to become narrower toward a bottom of the hole or groove, an aspect ratio of the opening portion is made larger.

21. A silicon film forming method for forming a silicon film on a workpiece having a processed surface and a hole or groove defined on the processed surface, comprising:
  forming multiple seed layers including a first seed layer and a second seed layer on the processed surface according to the silicon film forming method of claim 1;

forming a silicon film by supplying a silane-based gas not containing an amino group onto the multiple seed layers and by depositing silicon on the multiple seed layers; and etching the silicon film while leaving the silicon film on a bottom of the hole or groove, wherein at least forming a silicon film and etching the silicon film are repeatedly performed to fill the hole or groove of the processed surface with the silicon film which is repeatedly formed.

22. The method of claim 21, wherein forming multiple seed layers; forming a silicon film; and etching the silicon film are repeatedly performed to fill the hole or groove of the processed surface with the silicon film which is repeatedly formed.

23. The method of claim 21, wherein the silane-based gas not containing an amino group, which is used when forming a silicon film, is a silane-based gas having an order equal to or lower than the high-order silane-based gas containing two or more silicon atoms in a molecular formula and not containing an amino group, which is used when forming multiple seed layers.

24. The method of claim 23, wherein the silane-based gas having an order equal to or lower than the high-order silane-based gas is $SiH_4$ or $Si_2H_6$.

25. The method of claim 21, wherein, when forming multiple seed layers, a source gas and a doping gas containing an impurity serving as a donor or an acceptor are simultaneously supplied at least during formation of the second seed layer.

26. The method of claim 21, further comprising:
after forming multiple seed layers, doping an impurity serving as a donor or an acceptor on the multiple seed layers.

27. The method of claim 21, wherein, when forming a silicon film, the silane-based gas not containing an amino group and a doping gas containing an impurity serving as a donor or an acceptor are simultaneously supplied.

28. The method of claim 21, further comprising:
after etching the silicon film, doping an impurity serving as a donor or an acceptor on the silicon film left on the bottom of the hole or groove.

29. The method of claim 26, wherein the impurity is doped by a vapor phase diffusion method.

* * * * *